(12) United States Patent
Takasawa et al.

(10) Patent No.: US 8,410,001 B2
(45) Date of Patent: Apr. 2, 2013

(54) METHOD OF MANUFACTURING SEMICONDUCTOR DEVICE, METHOD OF PROCESSING SUBSTRATE, AND SUBSTRATE PROCESSING APPARATUS

(75) Inventors: Yushin Takasawa, Toyama (JP); Yoshiro Hirose, Toyama (JP); Tsukasa Kamakura, Toyama (JP); Yukinao Kaga, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/047,367

(22) Filed: Mar. 14, 2011

(65) Prior Publication Data
US 2011/0230057 A1 Sep. 22, 2011

(30) Foreign Application Priority Data

Mar. 16, 2010 (JP) .................................. 2010-058955
Dec. 7, 2010 (JP) .................................. 2010-272687

(51) Int. Cl.
*H01L 21/31* (2006.01)
*C23C 16/36* (2006.01)
*C23C 16/44* (2006.01)
*C23C 16/52* (2006.01)

(52) U.S. Cl. .................................. 438/763; 257/E21.24
(58) Field of Classification Search .................. 438/763; 257/E21.24; 118/704
See application file for complete search history.

(56) References Cited

U.S. PATENT DOCUMENTS

2008/0213479 A1 9/2008 Chou et al.
2010/0130024 A1* 5/2010 Takasawa et al. ............. 438/761

FOREIGN PATENT DOCUMENTS

JP 2008-227460 A 9/2008
JP 2010-153795 A 7/2010

* cited by examiner

*Primary Examiner* — Calvin Lee
*Assistant Examiner* — Monica D Harrison
(74) *Attorney, Agent, or Firm* — Volpe And Koenig, P.C.

(57) ABSTRACT

An excellent type of a film is realized by modifying conventional types of films. A carbonitride film of a predetermined thickness is formed on a substrate by performing, a predetermined number of times, a cycle including the steps of: supplying a source gas into a process vessel accommodating the substrate under a condition where a CVD reaction is caused, and forming a first layer including an element on the substrate; supplying a carbon-containing gas into the process vessel to form a layer including carbon on the first layer, and forming a second layer including the element and the carbon; supplying the source gas into the process vessel under a condition where a CVD reaction is caused to additionally form a layer including the element on the second layer, and forming a third layer including the element and the carbon; and supplying a nitrogen-containing gas into the process vessel to nitride the third layer, and forming a carbonitride layer serving as a fourth layer including the element, the carbon, and nitrogen.

15 Claims, 6 Drawing Sheets

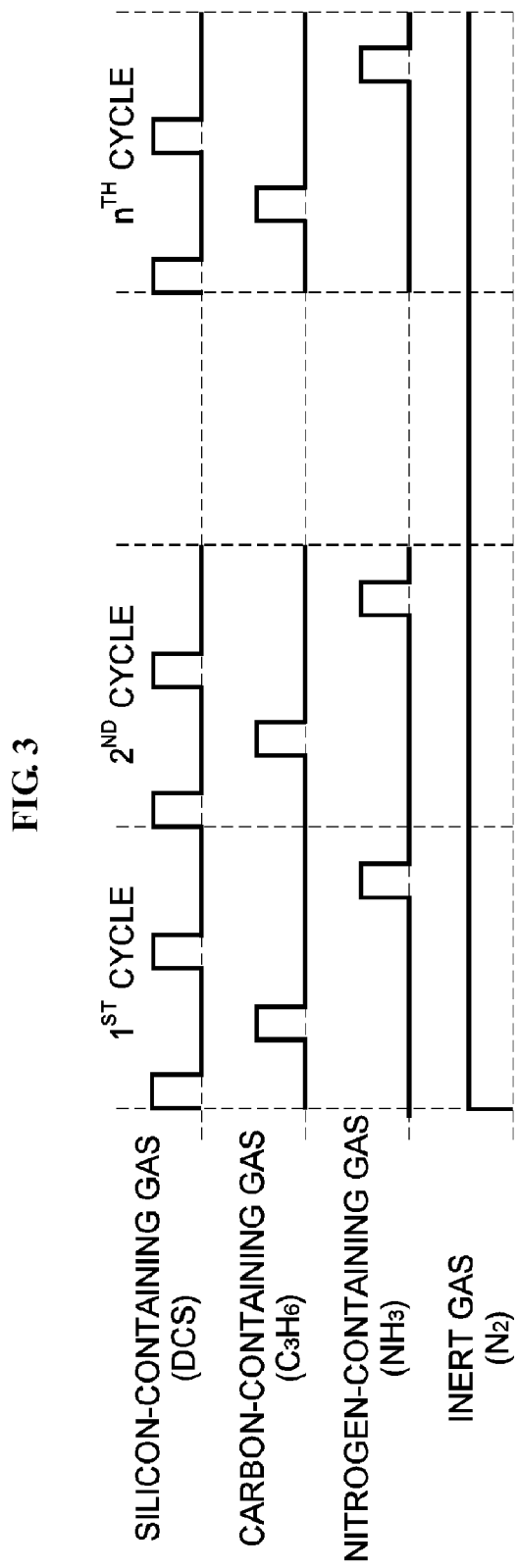

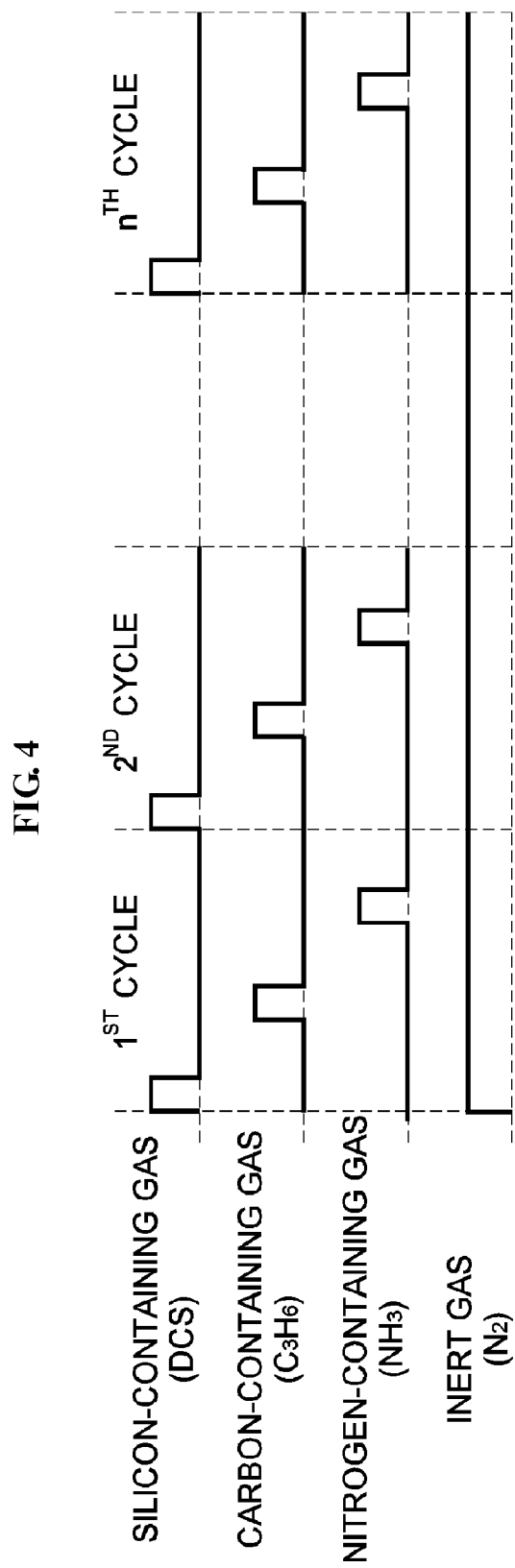

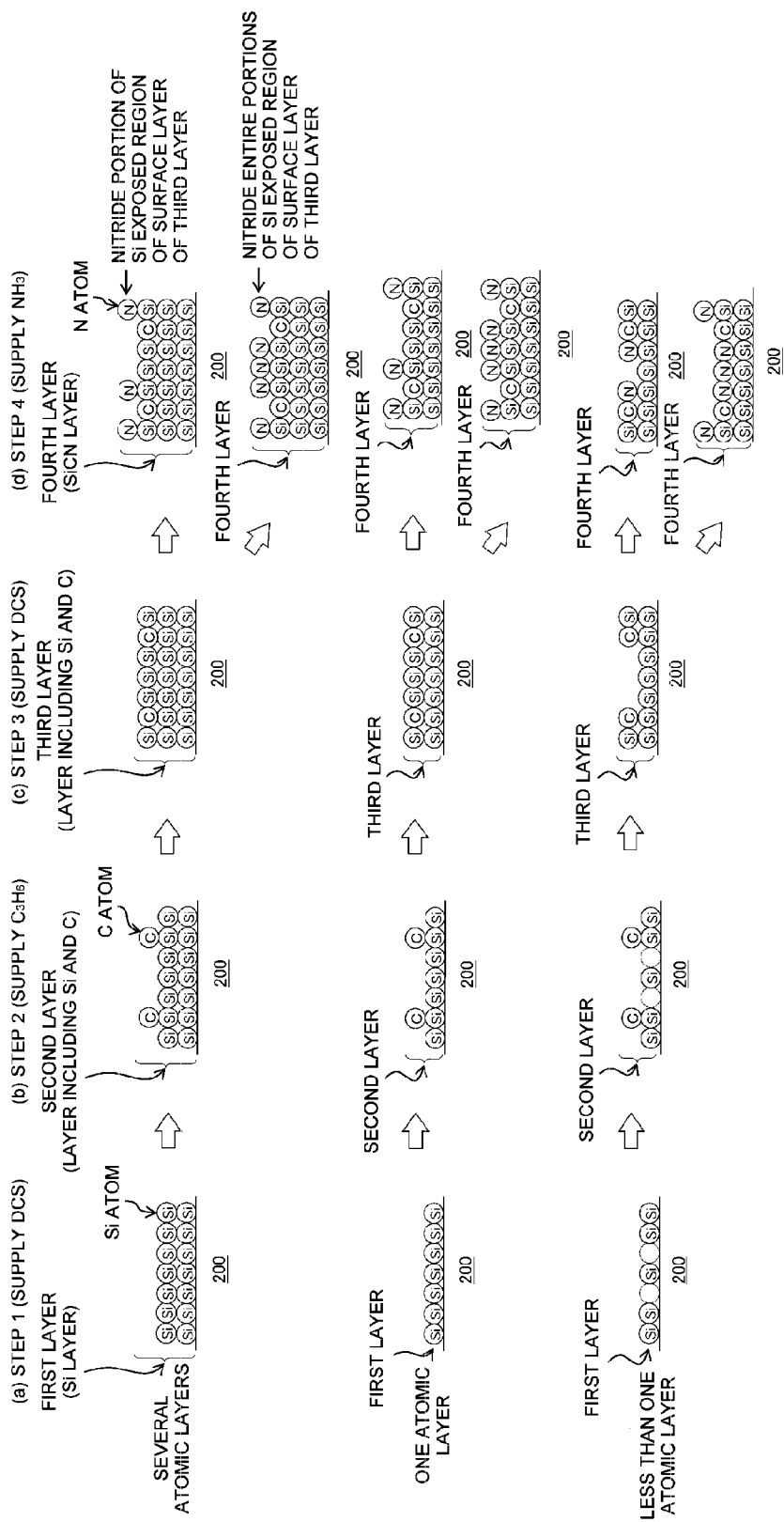

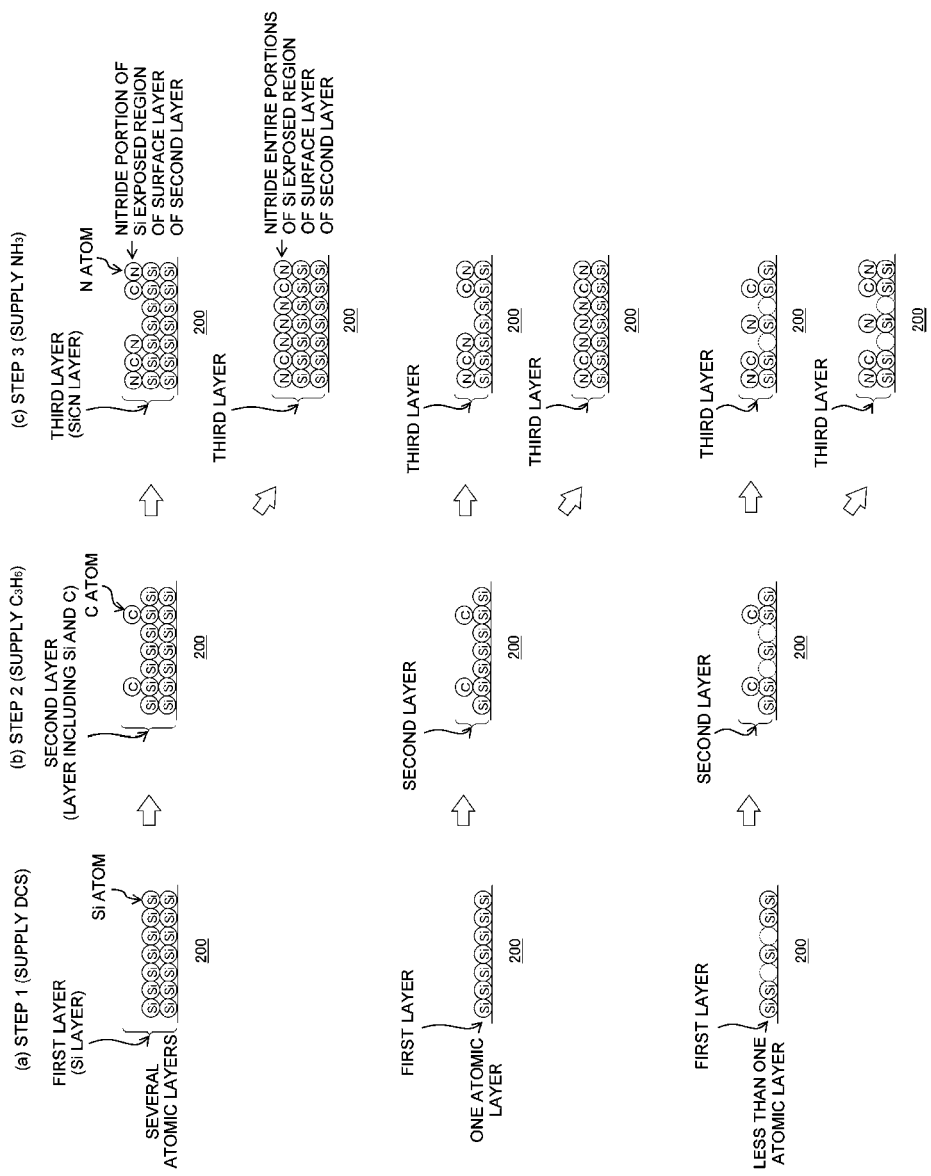

US 8,410,001 B2

METHOD OF MANUFACTURING SEMICONDUCTOR DEVICE, METHOD OF PROCESSING SUBSTRATE, AND SUBSTRATE PROCESSING APPARATUS

CROSS-REFERENCE TO RELATED PATENT APPLICATION

This application claims priority to and the benefit of Japanese Patent Application Nos. 2010-058955 filed on Mar. 16, 2010 and 2010-272687 filed on Dec. 7, 2010, the disclosure of which is incorporated herein by reference.

1. FIELD OF THE INVENTION

The present invention relates to a method of manufacturing a semiconductor device including a process of forming a thin film on a substrate, a method of processing a substrate, and a substrate processing apparatus.

2. DESCRIPTION OF THE RELATED ART

Processes of manufacturing a semiconductor device includes a process of forming an insulating layer such as a silicon oxide ($SiO_2$) film or a silicon nitride ($Si_3N_4$) film on a substrate. The $SiO_2$ film is widely used as an insulating film or an interlayer film due to its excellent insulating property and low dielectric property. The $Si_3N_4$ film is widely used as an insulating film, a mask film, a charge accumulating film, or a stress control film due to its excellent insulating property, corrosion-resistant property, dielectric property, and film stress controlling property. The $SiO_2$ film and the $Si_3N_4$ film are formed using a film-forming method such as chemical vapor deposition (CVD) or atomic layer deposition (ALD).

In recent years, as semiconductor devices are becoming finer, conventional film qualities cannot secure performance of the semiconductor devices. Due to deterioration of film qualities generated by a decrease in temperature of substrate processing processes, the performance of semiconductor devices cannot be secured. Although new types of films are being developed to secure the performance of the semiconductor devices, the performance of the semiconductor devices is strongly expected to be secured by modifying conventional types of films due to problems (costs and effects on other processes) accompanied by development of the new types of films.

SUMMARY OF THE INVENTION

Therefore, it is an object of the present invention to provide a method of manufacturing a semiconductor device, a method of processing a substrate, and a substrate processing apparatus which are capable of realizing a film quality more excellent than the conventional film quality and securing the performance of the semiconductor devices by modifying the conventional types of films.

TECHNICAL SOLUTION

According to one aspect of the present invention, there is provided a method of manufacturing a semiconductor device, including steps of: (a) supplying a source gas containing an element into a process vessel accommodating a substrate under a condition where a CVD reaction is caused to form a first layer including the element on the substrate; (b) supplying a carbon-containing gas into the process vessel to form a layer including a carbon on the first layer, thereby forming a second layer including the element and the carbon; (c) supplying the source gas containing the element into the process vessel under the condition where the CVD reaction is caused to additionally form a layer including the element on the second layer, thereby forming a third layer including the element and the carbon; (d) supplying a nitrogen-containing gas into the process vessel to nitride the third layer, thereby forming a carbonitride layer serving as a fourth layer including the element, the carbon and a nitrogen; and (e) performing a cycle including the steps (a) through (d) a predetermined number of times to form a carbonitride film having a predetermined thickness on the substrate.

According to another aspect of the present invention, there is provided a method of processing a substrate, including steps of: (a) supplying a source gas containing an element into a process vessel accommodating the substrate under a condition where a CVD reaction is caused to form a first layer including the element on the substrate; (b) supplying a carbon-containing gas into the process vessel to form a layer including a carbon on the first layer, thereby forming a second layer including the element and the carbon; (c) supplying the source gas containing the element into the process vessel under the condition where the CVD reaction is caused to additionally form a layer including the element on the second layer, thereby forming a third layer including the element and the carbon; (d) supplying a nitrogen-containing gas into the process vessel to nitride the third layer, thereby forming a carbonitride layer serving as a fourth layer including the element, the carbon and nitrogen; and (e) performing a cycle including the steps (a) through (d) a predetermined number of times to form a carbonitride film having a predetermined thickness on the substrate.

According to still another aspect of the present invention, there is provided a substrate processing apparatus including: a process vessel configured to accommodate a substrate; a heater configured to heat the substrate in the process vessel; a source gas supply system configured to supply a source gas containing an element into the process vessel; a carbon-containing gas supply system configured to supply a carbon-containing gas into the process vessel; a nitrogen-containing gas supply system configured to supply a nitrogen-containing gas into the process vessel; a pressure regulating unit configured to regulate a pressure in the process vessel; and a control unit configured to control the heater, the source gas supply system, the carbon-containing gas supply system, the nitrogen-containing gas supply system, and the pressure regulating unit such that a carbonitride film having a predetermined thickness is formed on the substrate by carrying out processes of (a) supplying the source gas containing the element into a process vessel accommodating the substrate under a condition where a CVD reaction is caused to form a first layer including the element on the substrate; (b) supplying the carbon-containing gas into the process vessel to form a layer including a carbon on the first layer, thereby forming a second layer including the element and the carbon; (c) supplying the source gas containing the element into the process vessel under the condition where the CVD reaction is caused to additionally form a layer including the element on the second layer, thereby forming a third layer including the element and the carbon; (d) supplying the nitrogen-containing gas into the process vessel to nitride the third layer, thereby forming a carbonitride layer serving as a fourth layer including the element, the carbon and a nitrogen; and (e) performing a cycle including the processes (a) through (d) a predetermined number of times.

According to the present invention, there are provided a method of manufacturing a semiconductor device, a method of processing a substrate, and a substrate processing apparatus which are capable of realizing a film quality more excellent than a conventional film quality and securing performance of a semiconductor device by modifying conventional types of films.

BRIEF DESCRIPTION OF THE DRAWINGS

FIG. 3 is a diagram illustrating gas supply timings in a first sequence according to an embodiment of the present invention;

FIG. 4 is a diagram illustrating gas supply timings in a second sequence according to the embodiment of the present invention;

FIG. 5 is a schematic view illustrating formation of a silicon carbonitride film on a wafer through the first sequence according to the embodiment of the present invention; and FIG. 6 is a schematic view illustrating formation of a silicon carbonitride film on a wafer through the second sequence according to the embodiment of the present invention.

DETAILED DESCRIPTION OF THE PREFERRED EMBODIMENTS

Hereinafter, an embodiment of the present invention will be described with reference to the accompanying drawings.

Figure 1:
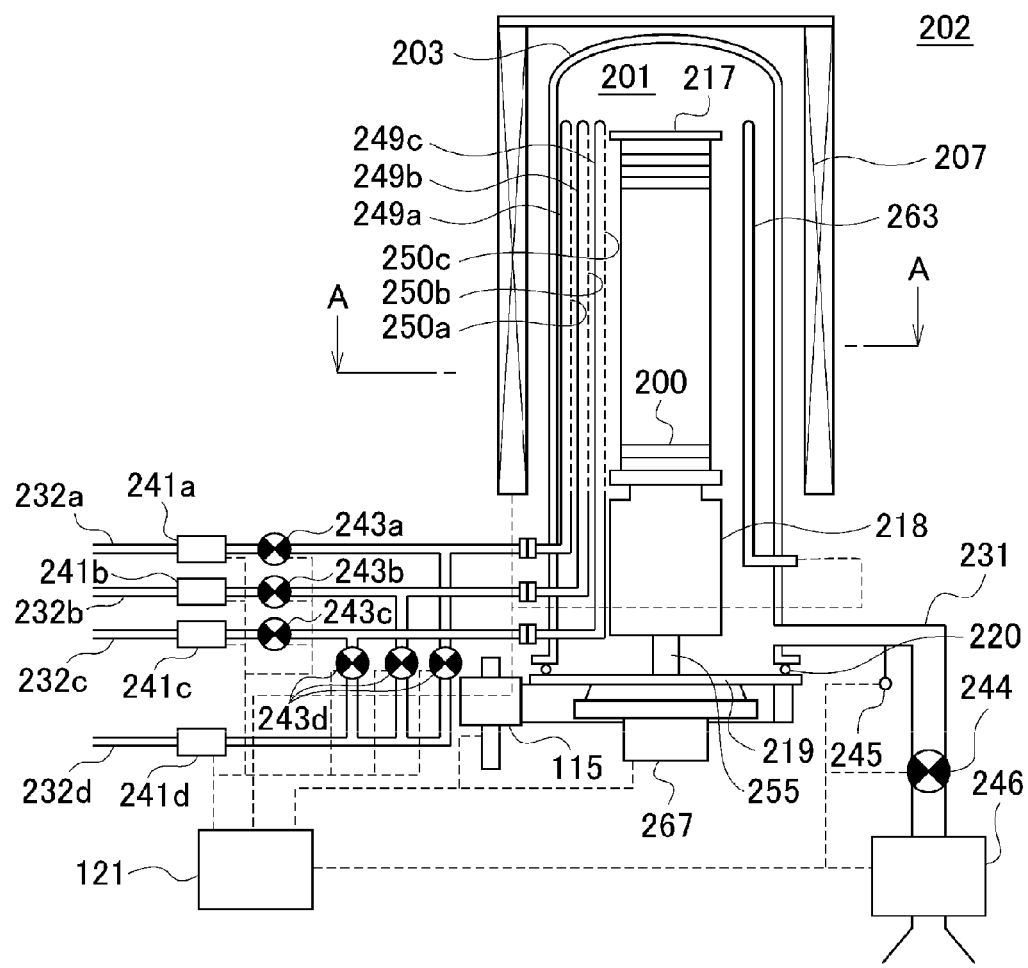
FIG. 1 is a schematic configuration diagram of a vertical process furnace of a substrate processing apparatus according to an exemplary embodiment of the present invention, illustrating a longitudinal cross section of a process furnace.
Figure 2:
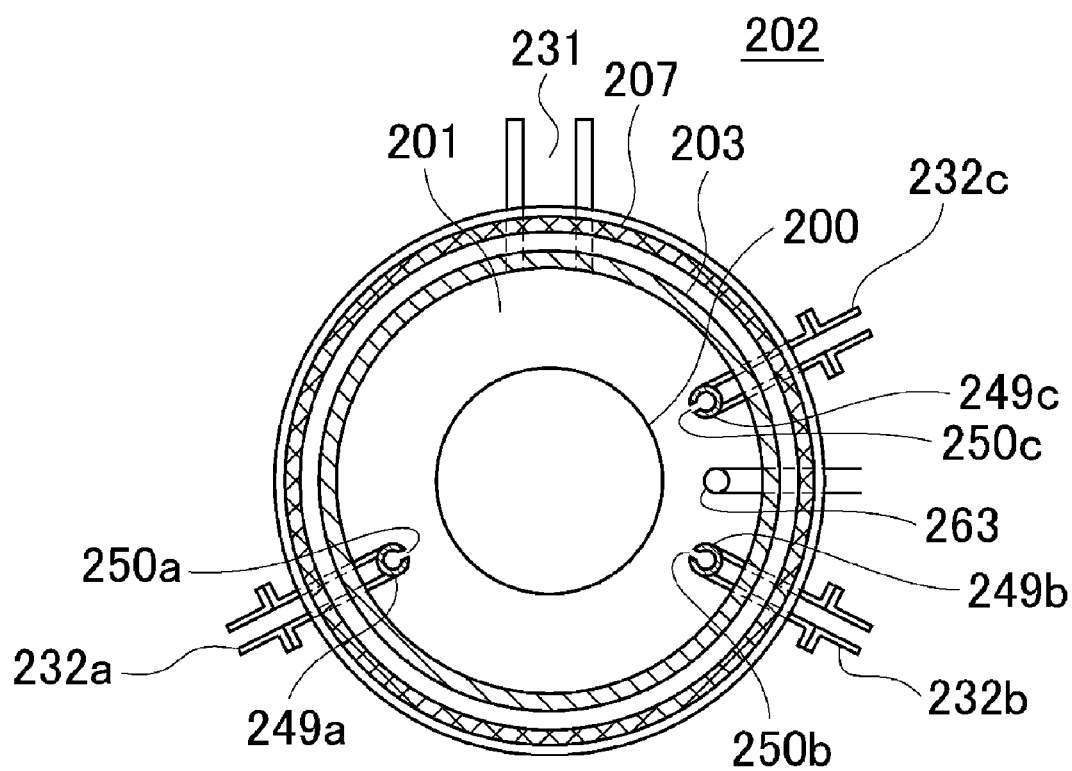
FIG. 2 is a schematic configuration diagram of the vertical process furnace of the substrate processing apparatus according to the exemplary embodiment of the present invention, illustrating a cross section of the process furnace taken along line A-A of FIG. 1.

FIG. 1 is a schematic configuration diagram of a vertical process furnace of a substrate processing apparatus according to an exemplary embodiment of the present invention, illustrating a longitudinal cross-sectional view of a process furnace 202. FIG. 2 is a schematic configuration diagram of the vertical process furnace according to the exemplary embodiment of the present invention, illustrating a cross section of the process furnace 202 taken along line A-A of FIG. 1.

As shown in FIG. 1, the process furnace 202 includes a heater 207, which is a heating means (heating device). The heater 207 has a cylindrical shape and is supported by a heater base (not shown), which is a holding plate, to be installed vertically. As will be described below, the heater 207 also functions as an activation device configured to activate gas by heat.

A reaction tube 203 having a shape concentric with the heater 207 and constituting a reaction vessel (process vessel) is installed inside the heater 207. The reaction tube 203 is, for example, made of a heat-resistant material such as quartz ($SiO_2$) or silicon carbide (SiC) and has a cylindrical shape with its upper end closed and lower end open. A process chamber 201 is formed in a hollow cylindrical portion of the reaction tube 203. The process chamber 201 is configured to accommodate wafers 200, which are substrates, in a horizontal posture in a state where the wafers 200 are vertically arranged in multiple stages by a boat 217 to be described below.

A first nozzle 249a, a second nozzle 249b, and a third nozzle 249c are installed inside the process chamber 201 so as to pass through a lower portion of the reaction tube 203. A first gas supply pipe 232a, a second gas supply pipe 232b, and a third gas supply pipe 232c are connected to the first nozzle 249a, the second nozzle 249b, and the third nozzle 249c respectively. In this way, the three nozzles 249a, 249b, and 249c and the three gas supply pipes 232a, 232b, and 232c are installed in the reaction tube 203 such that many kinds of gases, for example, three kinds of gases here, may be supplied into the process chamber 201.

A mass flow controller (MFC) 241a, which is a flow rate control device (flow rate control unit), and a valve 243a, which is an opening/closing valve, are installed in the first gas supply pipe 232a in order from an upstream side thereof. Also, the above-described first nozzle 249a is connected to a tip end portion of the first gas supply pipe 232a. The first nozzle 249a is vertically installed in an arc-shaped space between an inner wall of the reaction tube 203 and the wafers 200 in a stacking direction of the wafers 200 along an upper portion from a lower portion of the inner wall of the reaction tube 203. The first nozzle 249a is an L-shaped long nozzle. A gas supply hole 250a configured to supply a gas is installed on a side surface of the first nozzle 249a. The gas supply hole 250a is opened toward the center of the reaction tube 203. A plurality of gas supply holes 250a are installed from a lower portion to an upper portion of the reaction tube 203 to have the same opening area and the same opening pitch. A first gas supply system includes the first gas supply pipe 232a, the MFC 241a, the valve 243a, and the first nozzle 249a.

An MFC 241b, which is a flow rate control device (flow rate control unit), and a valve 243b, which is an opening/closing valve, are installed in the second gas supply pipe 232b in order from an upstream side thereof. Also, the above-described second nozzle 249b is connected to a tip end portion of the second gas supply pipe 232b. The second nozzle 249b is vertically installed in an arc-shaped space between an inner wall of the reaction tube 203 and the wafers 200 in a stacking direction of the wafers 200 along an upper portion from a lower portion of the inner wall of the reaction tube 203. The second nozzle 249b is an L-shaped long nozzle. A gas supply hole 250b configured to supply a gas is installed on a side surface of the second nozzle 249b. The gas supply hole 250b is opened toward the center of the reaction tube 203. A plurality of gas supply holes 250b are installed from a lower portion to an upper portion of the reaction tube 203 to have the same opening area and the same opening pitch. A second gas supply system includes the second gas supply pipe 232b, the MFC 241b, the valve 243b, and the second nozzle 249b.

An MFC 241c, which is a flow rate control device (flow rate control unit), and a valve 243c, which is an opening/closing valve, are installed in the third gas supply pipe 232c in order from an upstream side thereof. Also, the above-described third nozzle 249c is connected to a tip end portion of the third gas supply pipe 232c. The third nozzle 249c is vertically installed in an arc-shaped space between an inner wall of the reaction tube 203 and the wafers 200 in a stacking direction of the wafers 200 along an upper portion from a lower portion of the inner wall of the reaction tube 203. The third nozzle 249c is an L-shaped long nozzle. A gas supply hole 250c configured to supply a gas is installed on a side surface of the third nozzle 249c. The gas supply hole 250c is opened toward the center of the reaction tube 203. A plurality of gas supply holes 250c are installed from a lower portion to an upper portion of the reaction tube 203 to have the same opening area and the same opening pitch. A third gas supply system includes the third gas supply pipe 232c, the MFC 241c, the valve 243c, and the third nozzle 249c.

Downstream side ends of an inert gas supply pipe 232d branched into three pipes are connected to a downstream side of the valve 243a of the first gas supply pipe 232a, a downstream side of the valve 243b of the second gas supply pipe 232b, and a downstream side of the valve 243c of the third gas supply pipe 232c, respectively. Valves 243d are installed in the three branched inert gas supply pipes 232d, respectively. An MFC 241d, which is a flow rate control device (flow rate control unit), is installed on an upstream side of branch points of the inert gas supply pipe 232d. The MFCs 241d may be installed in the three branched inert gas supply pipes 232d, respectively. An inert gas supply system includes the inert gas supply pipe 232d, the MFC 241d, and the valves 243d.

For example, a silicon source gas, i.e. a gas containing Si (silicon-containing gas) is supplied into the process chamber 201 via the first gas supply pipe 232a in which the MFC 241a and the valve 243a are installed and the first nozzle 249a. The silicon-containing gas includes, for example, dichlorosilane ($SiH_2Cl_2$, DCS) gas and hexachlorodisilane ($Si_2Cl_6$, HCD) gas. When a liquid material which is in a liquid state at a normal temperature and under a normal pressure like HCD is used, the liquid material is vaporized by a vaporizing system such as a vaporizer or a bubbler to be supplied as a source gas.

For example, a gas including carbon (carbon-containing gas) is supplied into the process chamber 201 via the second gas supply pipe 232b in which the MFC 241b and the valve 243b are installed and the second nozzle 249b. The carbon-containing gas includes, for example, propylene ($C_3H_6$) gas.

For example, a gas containing nitrogen (nitrogen-containing gas) is supplied into the process chamber 201 via the third gas supply pipe 232c in which the MFC 241c and the valve 243c are installed and the third nozzle 249c. The nitrogen-containing gas includes, for example, ammonia ($NH_3$) gas.

For example, nitrogen ($N_2$) gas is supplied into the process chamber 201 via the inert gas supply pipe 232d in which the MFC 241d and the valves 243d are installed, the gas supply pipes 232a, 232b, and 232c, and the gas nozzles 249a, 249b, and 249c.

When the above-described gases flow, for example, through the gas supply pipes, the first gas system constitutes a source gas supply system, i.e. a silicon-containing gas supply system (silane-based gas). The second gas supply system also constitutes a carbon-containing gas supply system. In addition, the third gas supply system constitutes a nitrogen-containing gas supply system.

An exhaust pipe 231 configured to exhaust an atmosphere in the process chamber 201 is installed in the reaction tube 203. A vacuum pump 246, which is a vacuum exhaust unit, is connected to the exhaust pipe 231 via a pressure sensor 245, which is a pressure detector (pressure detecting unit), configured to detect a pressure in the process chamber 201 and an auto pressure controller (APC) valve 244, which is a pressure regulator (pressure regulating unit). Thus, the process chamber 201 may be vacuum-exhausted such that a pressure in the process chamber 201 becomes a predetermined pressure (vacuum degree). Also, the APC valve 244 is an opening/closing valve that may vacuum-exhaust an interior of the process chamber 201 or stop vacuum-exhausting an interior of the process chamber 201 as it is opened and closed and may regulate a pressure in the process chamber 201 according to an opening degree of the valve 244. Mainly, the exhaust pipe 231, the APC valve 244, the vacuum pump 246, and the pressure sensor 245 constitute an exhaust system.

A seal cap 219, which is a furnace port cover configured to hermetically seal a lower end opening of the reaction tube 203, is installed on a lower portion of the reaction tube 203. The seal cap 219 is installed to vertically contact a lower end of the reaction tube 203 on the lower side of the reaction tube 203. For example, the seal cap 219 is made of a metal such as stainless steel and has a disk shape. An O-ring 220, which is a seal member, contacting a lower end of the reaction tube 203 is installed on an upper surface of the seal cap 219. A boat rotating mechanism 267 configured to rotate the boat 217 is installed in an opposite side of the process chamber 201 with respect to a center of the seal cap 219. A rotary shaft 255 of the boat rotating mechanism 267 passes through the seal cap 219 to be connected to the boat 217 to be described below, and is configured to rotate the wafers 200 while rotating the boat 217. The seal cap 219 is configured to be vertically elevated by a boat elevator 115, which is an elevation mechanism, vertically installed outside the reaction tube 203 so that the boat 217 can be loaded into the process chamber 201 or the boat 217 can be unloaded from the process chamber 201.

The boat 217, which is a substrate supporting tool, is made of a heat-resistant material, for example, such as $SiO_2$ or SiC and is configured to concentrically align a plurality of wafers 200 in a horizontal posture and support the plurality of wafers 200 in multiple stages. Also, an insulating member 218 made of a heat-resistant material, for example, such as $SiO_2$ or SiC is configured to be installed at a lower portion of the boat 217 such that heat from the heater 207 cannot be easily transferred to the seal cap 219. Also, the insulating member 218 may include a plurality of insulating plates made of a heat-resistant material such as $SiO_2$ or SiC, and an insulating plate holder configured to support the insulating plates in a horizontal posture in multiple stages.

A temperature sensor 263, which is a temperature detector, is installed inside the reaction tube 203. The process chamber 201 is configured to have a desired temperature distribution by regulating power supplied to the heater 207 based on temperature information detected by the temperature sensor 263. The temperature sensor 263 is L-shaped like the nozzles 249a, 249b, and 249c and is installed along an inner wall of the reaction tube 203.

A controller 121, which is a control unit (control means), is connected to the MFCs 241a, 241b, 241c, and 241d, the valves 243a, 243b, 243c, and 243d, the pressure sensor 245, the APC valve 244, the vacuum pump 246, the heater 207, the temperature sensor 263, the boat rotating mechanism 267, the boat elevator 115, etc. The controller 121 controls flow rate regulating operations for various gases by the MFCs 241a, 241b, 241c, and 241d, opening/closing operations of the valves 243a, 243b, 243c, and 243d, a pressure regulating operation based on opening/closing of the APC valve 244 and the pressure sensor 245, a temperature regulating operation of the heater 207 based on the temperature sensor 263, starting and stopping of the vacuum pump 246, a rotating speed regulating operation of the boat rotating mechanism 267, an elevating operation of the boat elevator 115, etc.

Next, a two sequence example (first sequence and a second sequence) of forming an insulating film on a substrate which is a process of the processes of manufacturing a semiconductor device using the process furnace of the above-described substrate processing apparatus will be described. In the following description, operations of the units constituting the substrate processing apparatus are controlled by the controller 121.

According to a conventional chemical vapor deposition (CVD) method, a plurality of gases containing a plurality of elements constituting a film to be formed are simultaneously supplied. According to a conventional atomic layer deposition (ALD) method, a plurality of gases containing a plurality of elements constituting a film to be formed are alternately supplied. In this case, a $SiO_2$ film or a $Si_3N_4$ film is formed by controlling gas supply conditions such as a flow rate of a supplied gas, a gas supplying time, and a plasma power during the gas supply. For example, the supply condition is controlled such that in the case of forming the $SiO_2$ film by the technology, the composition ratio of the $SiO_2$ film becomes a stoichiometric composition ratio of O/Si≈2, and in the case of forming the $Si_3N_4$ film, the composition ratio of the $Si_3N_4$ film becomes a stoichiometric composition ratio of N/Si≈1.33.

According to the embodiment of the present invention, a supply condition is controlled such that a composition ratio of a film to be formed becomes a stoichiometric composition ratio or a predetermined composition ratio different from the stoichiometric composition ratio. For example, a supply condition is controlled such that at least one of a plurality of elements constituting a film to be formed has a more excessive stoichiometric composition ratio than those of the other elements. Hereinafter, a sequence example of forming a film by controlling a ratio of the plurality of elements constituting the film to be formed, i.e. the composition ratio of the film to be formed, will be described.

<First Sequence>

First, a first sequence according to an embodiment of the present invention will be described.

FIG. 3 is a diagram illustrating gas supply timings in a first sequence according to the embodiment of the present invention. FIG. 5 is a schematic view illustrating formation of a silicon carbonitride film on a wafer through the first sequence according to the embodiment of the present invention.

In the first sequence according to the embodiment of the present invention, a silicon carbonitride film having a predetermined thickness is formed on a wafer 200 by performing a cycle including the steps of:

(a) supplying a silicon-containing gas into a process vessel accommodating the wafer 200 under a condition where a CVD reaction is caused, and forming a first layer including Si (silicon) on the wafer 200;

(b) supplying a carbon-containing gas into the process vessel to form a layer including C (carbon) on the first layer including Si, and forming a second layer including the Si and the C;

(c) supplying a silicon-containing gas into the process vessel under a condition where a CVD reaction is caused to additionally form a layer including the Si on the second layer, and forming a third layer including the Si and the C; and (d) supplying a nitrogen-containing gas into the process vessel to nitride the third layer, and forming a silicon carbonitride layer serving as a fourth layer including the Si, the C, and N (nitrogen), a predetermined number of times (once or more), preferably a plurality of times.

The step (a) is performed under a condition where a CVD reaction is caused. In this case, a Si layer of less than one atomic layer to several atomic layers, which is the first layer including Si, is formed on the wafer 200. The first layer may be a chemical adsorption layer of a silicon-containing gas. Si is an element that becomes solid by itself. Here, the Si layer is a general term including a continuous layer or a discontinuous layer composed of Si, or a thin film formed by overlaying the continuous layer or the discontinuous layer. The continuous layer including Si is often referred to as a thin film. The chemical adsorption layer of the silicon-containing gas also includes a discontinuous chemical adsorption layer in addition to the continuous chemical adsorption layer of molecules of the silicon-containing gas. A layer of less than one atomic layer means a discontinuously formed atomic layer. A Si layer, i.e. a Si deposition layer is formed by depositing Si on the wafer 200 under a condition where a silicon-containing gas is self-decomposed. A chemical adsorption layer of a silicon-containing gas is formed by chemically adsorbing the silicon-containing gas on the wafer 200 under a condition where the silicon-containing gas is not self-decomposed. It is more preferable to form a Si layer on the wafer 200 than to form a chemical adsorption layer of the silicon-containing gas in order to increase a film-forming rate.

In the step (b), a layer including C of less than one atomic layer is formed on the first layer including Si by thermally activating and supplying a carbon-containing gas. A SiC layer may also be formed by reacting a portion of the first layer including Si with a carbon-containing gas and modifying the first layer using carbonization. Accordingly, the second layer including Si and C is formed. The carbon-containing layer formed on the first layer may be a C layer or a chemical adsorption layer of a carbon-containing gas. The chemical adsorption layer of the carbon-containing gas means a chemical adsorption layer of a material produced by decomposing the carbon-containing gas. Here, the C layer is a discontinuous layer composed of C. Also, the chemical adsorption layer of the carbon-containing gas is a discontinuous chemical adsorption layer of molecules of a material produced by decomposing a carbon-containing gas. Also, the layer including C is a discontinuous chemical adsorption layer of molecules of a material produced by decomposing a carbon-containing gas, i.e. a chemical adsorption layer of less than one atomic layer, and thus a controllability of a composition ratio of a thin film may be enhanced.

The step (c) is performed under a condition where a CVD reaction is caused as described in the step (a). In this case, a Si layer, which is a layer including Si of less than one atomic layer to several atomic layers, may be additionally formed on the second layer including Si and C. The layer including Si may be a chemical adsorption layer of a silicon-containing gas. Here, the Si layer or the chemical adsorption layer of the silicon-containing gas formed on the second layer is formed in a similar manner to the layer formed in the step (a). Accordingly, the third layer including Si and C is formed.

In the step (d), a layer including Si, C, and N, i.e. a silicon carbonitride layer, is formed by thermally activating and supplying a nitrogen-containing gas, and reacting the third layer including Si and C with a nitrogen-containing gas and modifying the third layer using nitridation. For example, when the third layer including Si and C of several atomic layers is formed in the step (c), a portion of a surface layer of the third layer reacts with a nitrogen-containing gas. Also, several layers below the surface layer of the third layer including Si and C of several atomic layers may react with a nitrogen-containing gas. Meanwhile, when the third layer is composed of several atomic layers including Si and C, only a surface layer thereof may be preferably modified to enhance controllability of a composition ratio of a thin film. N (nitrogen) is an element that does not become solid by itself. Since a soft reaction may be caused by thermally activating and supplying a nitrogen-containing gas rather than by activating the nitrogen-containing gas using plasma to supply the nitrogen-containing gas, modification, that is, nitridation may be preferably softly performed.

Hereinafter, the first sequence according to the embodiment of the present invention will be described in detail. Here, an example of forming a silicon carbonitride film (SiCN film), which is an insulating film, on a substrate through the sequence of FIG. 3 will be described on the assumption that DCS gas is used as the silicon-containing gas, $C_3H_6$ gas is used as the carbon-containing gas, and $NH_3$ gas is used as the nitrogen-containing gas.

When a plurality of wafers 200 are charged into a boat 217 (wafer charging), as illustrated in FIG. 1, the boat 217 supporting the plurality of wafers 200 is lifted by the boat elevator 115 and is loaded into the process chamber 201 (boat loading). In this state, the seal cap 219 seals a lower end of the reaction tube 203 via the O-ring 220.

An interior of the process chamber 201 is vacuum-exhausted by the vacuum pump 246 such that a pressure in the process chamber 201 becomes a desired pressure (vacuum degree). In this case, the pressure in the process chamber 201 is measured by the pressure sensor 245 and the APC valve 244 is feedback controlled based on the measured pressure information (pressure regulation). Also, an interior of the process chamber 201 is heated by the heater 207 so that the temperature in the process chamber 201 becomes a desired temperature. In this case, a current flow to the heater 207 is feedback controlled based on temperature information detected by the temperature sensor 263 so that a temperature distribution in the process chamber 201 becomes a desired temperature distribution (temperature regulation). Subsequently, the wafer 200 is rotated by rotating the boat 217 with the boat rotary mechanism 267 (wafer rotation). Thereafter, the following four steps are sequentially executed.

[First Step]

The valve 243a of the first gas supply pipe 232a is opened, and the DCS gas is flown into the first gas supply pipe 232a. A flow rate of the DCS gas introduced into the first gas supply pipe 232a is regulated by the MFC 241a. The DCS gas whose flow rate has been regulated is supplied into the process chamber 201 through a gas supply hole 250a of the first nozzle 249a and is exhausted through the exhaust pipe 231. In this case, the valve 243d of the inert gas supply pipe 232d connected to the first gas supply pipe 232a is opened, and an inert gas such as $N_2$ gas is flown into the inert gas supply pipe 232d at the same time. A flow rate of the $N_2$ gas introduced into the inert gas supply pipe 232d is regulated by the MFC 241d. The $N_2$ gas whose flow rate has been regulated is supplied into the process chamber 201 together with the DCS gas and is exhausted through the exhaust pipe 231.

In this case, a pressure in the process chamber 201 is regulated, for example, to a range of 10 to 1,000 Pa by properly controlling the APC valve 244. A flow rate of the DCS gas controlled by the MFC 241a is regulated, for example, to a range of 10 to 2,000 sccm. A flow rate of the $N_2$ gas controlled by the MFC 241d is regulated, for example, to a range of 200 to 1,000 sccm. An exposure time of the DCS gas to the wafer 200, i.e. a gas supply time (irradiation time), is set, for example, to a range of 1 to 120 seconds. In this case, a temperature of the heater 207 is set such that a temperature at which a CVD reaction is caused in the process chamber 201, i.e. a temperature of the wafer 200 becomes, for example, 300° C. to 650° C. When a temperature of the wafer 200 is less than 300° C., adsorption of the DCS gas onto the wafer 200 is difficult. When a temperature of the wafer 200 exceeds 650° C., uniformity may be easily deteriorated due to strong CVD reaction. Thus, a temperature of the wafer 200 is preferably in a rage of 300° C. to 650° C.

The first layer including Si is formed on an underlayer film of a surface of the wafer 200 by supplying DCS gas. That is, as shown in FIG. 5A, a Si layer, which is a silicon-containing layer of less than one atomic layer to several atomic layers, is formed on the wafer 200 (on the underlayer film). The silicon-containing layer may be a chemical adsorption layer of the DCS gas. Here, the Si layer is a general term for a layer made of silicon, such as a continuous layer, a discontinuous layer, and a thin film in which such layers are overlapped. The chemical adsorption layer of the DCS also includes a discontinuous chemical adsorption layer in addition to the continuous chemical adsorption layer of the DCS molecules. Further, when the thickness of the silicon-containing layer formed on the wafer 200 is greater than the thickness of several atomic layers, a nitridation effect in Step 4, which will be described later, does not affect the entire silicon-containing layer. Furthermore, the minimum of the silicon-containing layer that can be formed on the wafer 200 is less than one atomic layer. Therefore, preferably, the thickness of the silicon-containing layer may range from the thickness of less than one atomic layer to the thickness of several atomic layers. A Si layer, i.e. a Si deposition layer, is formed by depositing Si on the wafer 200 under a condition where the DCS gas is self-decomposed. A chemical adsorption layer of the DCS gas is formed by chemically adsorbing the DCS gas on the wafer 200 under a condition where the DCS gas is not self-decomposed. It is more preferable to form a Si layer on the wafer 200 than to form a chemical adsorption layer of the DCS gas in order to increase a film-forming rate.

After the silicon-containing layer is formed, the valve 243a is closed to stop supply of the DCS gas. In this case, the APC valve 244 of the exhaust pipe 231 is kept open to vacuum-exhaust the interior of the process chamber 201 using the vacuum pump 246, and the residual DCS gas in the process chamber 201, which has not been reacted or has contributed to formation of the silicon-containing layer, is removed from the process chamber 201. In this case, the valve 243d is also kept open to maintain supply of the $N_2$ gas into the process chamber 201. Accordingly, the residual DCS gas in the process chamber 201 which has not been reacted or has contributed to formation of the silicon-containing layer may be effectively removed from the process chamber 201.

The silicon-containing gas used herein may include, in addition to the DCS gas, an organic source such as amino silane-based tetrakisdimethylaminosilane ($Si[N(CH_3)_2]_4$, 4DMAS) gas, trisdimethylaminosilane ($Si[N(CH_3)_2]_3H$, 3DMAS) gas, bisdiethylaminosilane ($Si[N(C_2H_5)_2]_2H_2$, 2DEAS) gas, and bistertiarybutylaminosilane ($SiH_2[NH(C_4H_9)]_2$, BTBAS), as well as an inorganic source such as hexachlorodisilane ($Si_2Cl_6$, HCD) gas, tetrachlorosilane ($SiCl_4$, STC) gas, trichlorosilane ($SiHCl_3$, TCS) gas, monochlorosilane ($SiH_3Cl$, MCS) gas, and monosilane ($SiH_4$) gas.

[Second Step]

After the first step is completed and the residual gas in the process chamber 201 is removed, the valve 243b of the second gas supply pipe 232b is opened to flow $C_3H_6$ gas into the second gas supply pipe 232b. A flow rate of the $C_3H_6$ gas introduced into the second gas supply pipe 232b is regulated by the MFC 241b. The $C_3H_6$ gas whose flow rate has been regulated is supplied into the process chamber 201 through a gas supply hole 250b of the second nozzle 249b and is exhausted through the exhaust pipe 231. In this case, the valve 243d of the inert gas supply pipe 232d connected to the second gas supply pipe 232b is opened to flow $N_2$ gas into the inert gas supply pipe 232d at the same time. A flow rate of the $N_2$ gas introduced into the inert gas supply pipe 232d is regulated by the MFC 241d. The $N_2$ gas whose flow rate has been regulated is supplied into the process chamber 201 together with $C_3H_6$ gas and is exhausted through the exhaust pipe 231.

In this case, a pressure in the process chamber 201 is regulated, for example, to a range of 50 to 3,000 Pa by properly controlling the APC valve 244. A flow rate of supplied $C_3H_6$ gas controlled by the MFC 241b is regulated, for example, to a range of 100 to 10,000 sccm. A flow rate of supplied $N_2$ gas controlled by the MFC 241d is regulated, for example, to a range of 200 to 2,000 sccm. In this case, a partial pressure of the $C_3H_6$ gas in the process chamber 201 is regulated to a range of 6 to 2,940 Pa. An exposure time of the $C_3H_6$ gas to the wafer 200, i.e. a gas supply time (irradiation time), is set, for example, to a range of 1 to 120 seconds. In this case, a temperature of the heater 207 is set such that a temperature of the wafer 200 becomes 300° C. to 650° C. as in the first step. Since a soft reaction may be caused by thermally activating and supplying the $C_3H_6$ gas, a carbon-containing layer to be described below may be easily formed.

In this case, the gas flowing into the process chamber 201 is thermally activated $C_3H_6$ gas, and DCS gas does not flow into the process chamber 201. Thus, the $C_3H_6$ gas does not cause a vapor phase reaction and is activated and supplied to the wafer 200. In this case, as shown in FIG. 5B, a carbon-containing layer of less than one atomic layer, i.e. a discontinuous carbon-containing layer, is formed on the silicon-containing layer formed on the wafer 200 in the first step. Accordingly, the second layer including Si and C is formed. The second layer including Si and C may be formed by reacting a portion of the silicon-containing layer with the $C_3H_6$ gas and modifying (carbonizing) the silicon-containing layer, depending on conditions.

The carbon-containing layer formed on the silicon-containing layer may be a C layer or may be a chemical adsorption layer of $C_3H_6$, that is, a chemical adsorption layer of a material ($C_xH_y$) produced by decomposing $C_3H_6$. Here, the C layer needs to be a discontinuous layer composed of C. In addition, the chemical adsorption layer of $C_xH_y$ needs to be a discontinuous chemical adsorption layer of $C_xH_y$ molecules. When a carbon-containing layer formed on a silicon-containing layer is a continuous layer, for example, when $C_xH_y$ forms a continuous chemical adsorption layer on a silicon-containing layer with adsorption of $C_xH_y$ onto the silicon-containing layer being in a saturated state, a surface of the silicon-containing layer is entirely covered with the chemical adsorption layer of $C_xH_y$. In this case, in a third step to be described below, since a silicon-containing layer is not formed on the second layer, Si is not present on a surface of the second layer. This is because the silicon-containing layer is not formed on the chemical adsorption layer of $C_xH_y$. Even when the fourth step to be described below is performed in this state, nitridation of the layer including Si and C is difficult. This is because while nitrogen binds to Si, it does not bind to C. In order to form a S-containing layer in the third step to be described below and in order to cause a desired nitridation reaction in the fourth step to be described below, a surface of the second layer needs to be exposed to Si with adsorption of $C_xH_y$ onto a silicon-containing layer being in an unsaturated state.

In order to make the adsorption of $C_xH_y$ onto the silicon-containing layer in an unsaturated state, the processing conditions in the second step may preferably be set to the above-described processing conditions. Furthermore, when the processing conditions in the second step are set to the following processing conditions, it becomes easy to make an adsorption state of $C_xH_y$ onto a silicon-containing layer an unsaturated state.

Temperature of wafer: 500 to 630° C.
Pressure in process chamber: 133 to 2,666 Pa
Partial pressure of $C_3H_6$ gas: 67 to 2,820 Pa
Flow rate of supplied $C_3H_6$ gas: 1,000 to 5,000 sccm
Flow rate of supplied $N_2$ gas: 300 to 1,000 sccm
Supply time of $C_3H_6$ gas: 6 to 100 seconds Thereafter, the valve 243b of the second gas supply pipe 232b is closed to stop supply of the $C_3H_6$ gas. In this case, the APC valve 244 of the exhaust pipe 231 is kept open to vacuum-exhaust the interior of the process chamber 201 using the vacuum pump 246, and the residual $C_3H_6$ gas in the process chamber 201 which has not been reacted or has contributed to formation of the carbon-containing layer is removed from the process chamber 201. In this case, the valve 243d of the inert gas supply pipe 232d connected to the second gas supply pipe 232b is kept open to maintain supply of the $N_2$ gas into the process chamber 201. Accordingly, the residual $C_3H_6$ gas in the process chamber 201 which has not been reacted or has contributed to formation of the carbon-containing layer may be effectively removed from the process chamber 201.

The carbon-containing gas may be acetylene ($C_2H_2$) gas or ethylene ($C_2H_4$) gas in addition to $C_3H_6$ gas.

[Third Step]

After the second step is completed and the residual gas in the process chamber 201 is removed, the valve 243a of the first gas supply pipe 232a is opened to flow DCS gas into the first gas supply pipe 232a. A flow rate of the DCS gas introduced into the first gas supply pipe 232a is regulated by the MFC 241a. The DCS gas whose flow rate has been regulated is supplied into the process chamber 201 through a gas supply hole 250a of the first nozzle 249a and is exhausted through the exhaust pipe 231. In this case, the valve 243d of the inert gas supply pipe 232d connected to the first gas supply pipe 232a is opened to flow an inert gas such as $N_2$ gas into the inert gas supply pipe 232d at the same time. A flow rate of the $N_2$ gas introduced into the inert gas supply pipe 232d is regulated by the MFC 241d. The $N_2$ gas whose flow rate has been regulated is supplied into the process chamber 201 together with DCS gas and is exhausted through the exhaust pipe 231.

In this case, a pressure in the process chamber 201 is regulated, for example, to a range of 10 to 1,000 Pa by properly controlling the APC valve 244. A flow rate of supplied DCS gas controlled by the MFC 241a is regulated, for example, to a range of 10 to 2,000 sccm. A flow rate of supplied $N_2$ gas controlled by the MFC 241d is regulated, for example, to a range of 200 to 1,000 sccm. An exposure time of the DCS gas to the wafer 200, i.e. a gas supply time (irradiation time), is set, for example, to a range of 1 to 120 seconds. In this case, a temperature of the heater 207 is set such that a temperature of the wafer 200 becomes a temperature at which a CVD reaction is caused in the process chamber 201, for example, 300° C. to 650° C.

A third layer including Si and C is formed by supplying DCS gas and additionally forming a layer including Si on the second layer including Si and C formed on the wafer 200 in the second step. That is, as shown in FIG. 5C, a Si layer, which is a silicon-containing layer of less than one atomic layer to several atomic layers, is formed on the second layer. The silicon-containing layer may be a chemical adsorption layer of DCS gas. Here, the Si layer or the chemical adsorption layer of DCS gas formed on the second layer is formed as in the first step.

After the silicon-containing layer is formed, the valve 243a is closed to stop supply of the DCS gas. In this case, the APC valve 244 of the exhaust pipe 231 is kept open to vacuum-exhaust the interior of the process chamber 201 using the vacuum pump 246, and the residual DCS gas in the process chamber 201 which has not been reacted or has contributed to formation of the silicon-containing layer is removed from the process chamber. In this case, the valve 243d of the insert gas supply pipe 232d connected to the first gas supply pipe 232a is kept open to maintain supply of the $N_2$ gas into the process chamber 201. Accordingly, the residual DCS gas in the process chamber 201 which has not been reacted or has contributed to formation of the silicon-containing layer may be effectively removed from the process chamber 201.

[Fourth Step]

After the third step is completed and the residual gas in the process chamber 201 is removed, the valve 243c of the third gas supply pipe 232c is opened to flow $NH_3$ gas into the third gas supply pipe 232c. A flow rate of the NH₃ gas introduced into the third gas supply pipe 232c is regulated by the MFC 241c. The NH₃ gas whose flow rate has been regulated is supplied into the process chamber 201 through a gas supply hole 250c of the third nozzle 249c and is exhausted through the exhaust pipe 231. Also, the NH₃ gas supplied into the process chamber 201 is thermally activated. In this case, the valve 243d of the inert gas supply pipe 232d connected to the third gas supply pipe 232c is opened to flow N₂ gas into the inert gas supply pipe 232d at the same time. A flow rate of the N₂ gas introduced into the inert gas supply pipe 232d is regulated by the MFC 241d. The N₂ gas whose flow rate has been regulated is supplied into the process chamber 201 together with NH₃ gas and is exhausted through the exhaust pipe 231.

When the NH₃ gas is thermally activated and flown, a pressure in the process chamber 201 is regulated, for example, to a range of 50 to 3,000 Pa by properly controlling the APC valve 244. A flow rate of supplied NH₃ gas controlled by the MFC 241c is regulated, for example, to a range of 1,000 to 10,000 sccm. A flow rate of supplied N₂ gas controlled by the MFC 241d is regulated, for example, to a range of 200 to 2,000 sccm. In this case, a partial pressure of the NH₃ gas in the process chamber 201 is regulated to a range of 6 to 2,940 Pa. An exposure time of the NH₃ gas to the wafer 200, i.e. a gas supply time (irradiation time), is set, for example, to a range of 1 to 120 seconds. In this case, a temperature of the heater 207 is set such that a temperature of the wafer 200 becomes 300° C. to 650° C. as in the first step. Since NH₃ gas does not easily react within the temperature of the wafer due to its high reaction temperature, it is thermally activated with the pressure in the process chamber 201 being a relatively high pressure. Since a soft reaction may be caused by thermally activating and supplying the NH₃ gas, nitridation to be described below may be softly performed.

In this case, the gas flowing in the process chamber 201 is thermally activated NH₃ gas, and DCS gas and C₃H₆ gas do not flow in the process chamber 201. Thus, the NH₃ gas does not cause a vapor phase reaction, and the activated NH₃ gas reacts with a portion of the layer including Si and C which is the third layer formed on the wafer 200 in the third step. Accordingly, the third layer is thermally nitrided in a non-plasma environment such that it is modified into the fourth layer including Si, C, and N, i.e. a silicon carbonitride layer (SiCN layer).

In this case, as shown in FIG. 5D, the nitridation reaction of the third layer is not allowed to be saturated. For example, when a Si layer of several atomic layers is formed in the first step, a carbon-containing layer of less than one atomic layer is formed in the second step, and a Si layer of less than one atomic layer is formed in the third step, a portion of the surface layer (one atomic layer of the surface) thereof is nitrided. That is, some or all portion of an area (an area exposed to Si) of the surface layer thereof where nitridation may be caused is nitrided. In this case, nitridation is performed under a condition where a nitridation reaction of the third layer is unsaturated so that the entire third layer cannot be nitrided. Although several layers below the surface layer of the third layer may be nitrided depending on conditions, only the surface layer is preferably nitrided to enhance controllability of the composition ratio of the silicon carbonitride film. For example, when a Si layer of one atomic layer or less than one atomic layer is formed in the first step, a carbon-containing layer of less than one atomic layer is formed in the second step, and a Si layer of less than one atomic layer is formed in the third step, a portion of the surface layer thereof is also nitrided likewise. Even in this case, nitridation is also performed under a condition where a nitridation reaction of the third layer is unsaturated so that the entire third layer cannot be nitrided.

The processing conditions in the fourth step preferably may be set to the above-described processing condition to make the nitridation reaction of the third layer in an unsaturated state. Furthermore, when processing conditions in the fourth step are set to the following processing conditions, the nitridation reaction of the third layer is more easily unsaturated.

Temperature of wafer: 500 to 630° C.
Pressure in process chamber: 133 to 2,666 Pa
Partial pressure of NH₃ gas: 67 to 2,820 Pa
Flow rate of supplied NH₃ gas: 1,000 to 5,000 sccm
Flow rate of supplied N₂ gas: 300 to 1,000 sccm
Supply time of NH₃ gas: 6 to 100 seconds Thereafter, the valve 243c of the third gas supply pipe 232c is closed to stop supply of the NH₃ gas. In this case, the APC valve 244 of the exhaust pipe 231 is kept open to vacuum-exhaust the interior of the process chamber 201 using the vacuum pump 246, and the residual NH₃ gas in the process chamber 201 which has not been reacted or has contributed to the nitridation is removed from the process chamber. In this case, the valve 243d of the inert gas supply pipe 232d connected to the third gas supply pipe 232c is kept open to maintain supply of the N₂ gas into the process chamber 201. Accordingly, the residual NH₃ gas in the process chamber 201 which has not been reacted or has contributed to the nitridation may be effectively removed from the process chamber 201

The nitrogen-containing gas may include diazine (N₂H₂) gas, hydrazine (N₂H₄) gas, or N₃H₈ gas in addition to the NH₃ gas.

A thin film including Si, C, and N which has a predetermined thickness, i.e. a silicon carbonitride film (SiCN film), may be formed on the wafer 200 by performing a cycle including the above-described first through fourth steps a predetermined number of times. Also, the above-described cycle is preferably repeated a plurality of times.

A composition ratio of the silicon carbonitride film, i.e. a ratio of Si, C, and N is controlled by controlling the respective processing conditions of the first through fourth steps. In the embodiment of the present invention, a composition radio is regulated according to a desired film quality by controlling the pressures, or the pressures and gas supply times, in the processing chamber 201 in each of the steps.

For example, when a composition ratio of the silicon carbonitride film is controlled to be a predetermined composition ratio different from its stoichiometric composition ratio, the pressures, or the pressures and gas supply times, in the process chamber 201 in the first and third steps are set to be higher and longer than the pressures, or the pressures and gas supply times, in the process chamber 201 in the first and third steps in the case of forming a silicon carbonitride film having a stoichiometric composition ratio. An amount of supplied Si is increased as compared with the case of forming a silicon carbonitride film having a stoichiometric composition ratio by controlling the above-mentioned conditions. In addition, the pressures, or the pressures and gas supply times, in the process chamber 201 in the first and third steps are set to be lower and shorter than the pressures, or the pressures and gas supply times, in the process chamber 201 in the first and third steps in the case of forming a silicon carbonitride film having a stoichiometric composition ratio. An amount of supplied Si is decreased as compared with the case of forming a silicon carbonitride film having a stoichiometric composition ratio by controlling the above-mentioned conditions. Accordingly, the composition ratio of Si in the silicon carbonitride film is controlled to be a predetermined composition ratio different from the stoichiometric composition ratio, i.e. a predetermined Si concentration.

For example, when the pressure, or the pressure and gas supply time, in the process chamber 201 in the second step is set to be higher and longer than the pressure, or the pressure and gas supply time, in the process chamber 201 in the second step in the case of forming a silicon carbonitride film having a stoichiometric composition ratio. An amount of supplied C is increased as compared with the case of forming a silicon carbonitride film having a stoichiometric composition ratio by controlling the above-mentioned conditions. In addition, the pressure, or the pressure and gas supply time, in the process chamber 201 in the second step is set to be lower and shorter than the pressure, or the pressure and gas supply time, in the process chamber 201 in the second step in the case of forming a silicon carbonitride film having a stoichiometric composition ratio. An amount of supplied C is decreased as compared with in the case of forming a silicon carbonitride film having a stoichiometric composition ratio by controlling the above-mentioned conditions. Accordingly, the composition ratio of C in the silicon carbonitride film is controlled to be a predetermined composition ratio different from the stoichiometric composition ratio, i.e. a predetermined C concentration.

For example, when the pressure, or the pressure and gas supply time, in the process chamber 201 in the fourth step is set to be higher and longer than the pressure, or the pressure and gas supply time, in the process chamber 201 in the fourth step in the case of forming a silicon carbonitride film having a stoichiometric composition ratio, an amount of supplied N is increased as compared with the case of forming a silicon carbonitride film having a stoichiometric composition ratio by controlling the above-mentioned conditions. In addition, the pressure, or the pressure and gas supply time, in the process chamber 201 in the fourth step is set to be lower and shorter than the pressure, or the pressure and gas supply time, in the process chamber 201 in the fourth step in the case of forming a silicon carbonitride film having a stoichiometric composition ratio. An amount of supplied N is decreased as compared with the case of forming a silicon carbonitride film having a stoichiometric composition ratio by controlling the above-mentioned conditions. Accordingly, the composition ratio of N in the silicon carbonitride film is controlled to be a predetermined composition ratio different from the stoichiometric composition ratio, i.e. a predetermined N concentration.

When a silicon carbonitride film of a certain film thickness having a predetermined composition is formed on the wafer 200, an inert gas such as $N_2$ gas is supplied into the process chamber 201 and is exhausted through the exhaust pipe 231 such that the interior of the process chamber 201 is purged by the inert gas (gas purging). Thereafter, the atmosphere in the process chamber 201 is substituted with the inert gas (inert gas substitution) and the pressure in the process chamber 201 is returned to a normal pressure (returning to an atmospheric pressure).

Thereafter, as the seal cap 219 is lowered by the boat elevator 115, a lower end of the reaction tube 203 is opened. At the same time, the processed wafer 200 is unloaded (boat unloading) from the lower end of the reaction tube 203 to an outside of the reaction tube 203 in a state where the processed wafer 200 is supported by the boat 217. Thereafter, the processed wafer 200 is discharged from the boat 217 (wafer discharging).

<Second Sequence>

Next, a second sequence according to the embodiment of the present invention will be described.

FIG. 4 is a diagram illustrating gas supply timings in a second sequence according to the embodiment of the present invention. FIG. 6 is a diagram illustrating formation of a silicon carbonitride (SiCN) film on a wafer 200 through the second sequence according to the embodiment of the present invention.

In the second sequence according to the embodiment of the present invention, a thin film of a desired thickness including Si, C, and N, i.e. a silicon carbonitride film, is formed on a wafer by performing a cycle including the first step, the second step, and the fourth step (excluding the third step) out of the first through fourth steps of the above-described first sequence a predetermined number of times.

That is, in the second sequence according to the embodiment of the present invention, a silicon carbonitride film having a predetermined thickness is formed on a wafer 200 by performing a cycle including the steps of:

(a) supplying a silicon-containing gas into a process vessel accommodating the wafer 200 under a condition where a CVD reaction is caused, and forming a first layer including Si on the wafer 200 (first step);

(b) supplying a carbon-containing gas into the process vessel to form a layer including C on the first layer including the Si, and forming a second layer including the Si and the C (second step); and (c) supplying a nitrogen-containing gas into the process vessel to nitride the second layer, and forming a silicon carbonitride layer serving as a third layer including the Si, the C, and N (third step), a predetermined number of times (once or more), preferably a plurality of times.

Processing conditions, reactions to be caused, layers to be formed, thicknesses of the layers to be formed, and gases to be used in the respective steps of the second sequence are the same as those in the respective steps of the first sequence. That is, the processing conditions, reactions to be caused, layers to be formed, thicknesses of the layers to be formed, and gases to be used in the first, second, and third steps of the second sequence are the same as those in the first, second, and fourth steps of the first sequence.

In the second sequence, DCS gas is supplied once per one cycle (first step), and one Si layer is formed per one cycle.

In this regard, in the first sequence, DCS gas may be supplied twice (first step and third step) in one cycle, and two Si layers may be formed per one cycle. That is, since the first sequence may increase an amount of adsorbed and deposited Si per cycle (two times or more) compared with the second sequence, a cycle rate may be enhanced.

In the second step of the second sequence, C, i.e. $C_xH_y$, is also adsorbed onto a Si layer by supplying $C_3H_6$ gas, in which case a Si—C bond is formed. Thereafter, when N, i.e. $NH_3$ gas, is supplied in the third step, since C and nitrogen are apt to competitively gain Si, a portion of the Si—C bond is substituted with Si—N bond. Thus, C may be separated. As a result, an amount of C introduced into a SiCN film, i.e. a C concentration in the SiCN film, may be reduced in the second sequence.

In this regard, according to the first sequence, C, i.e. $C_xH_y$, is adsorbed onto a Si layer by supplying $C_3H_6$ gas in the second step and Si is adsorbed and deposited in the third step, resulting in increased probability of forming a Si—C—Si bond. Thereafter, even when N, i.e. $NH_3$ gas, is supplied in the fourth step, an attack of nitrogen is blocked by Si forming the Si—C—Si bond, and thus separation of C may be difficult and C may easily reside. As a result, an amount of C introduced to the SiCN, i.e. a C concentration in the SiCN film, is enhanced.

Both adsorption of $C_xH_y$ onto the Si layer in the second step of the second sequence and nitridation of the second layer by $NH_3$ gas in the third step of the second sequence need to be stopped when they are in an unsaturated state. When the nitridation of the second layer by $NH_3$ gas in the third step is saturated, a large amount of C is separated and a C concentration in the SiCN film is severely lowered.

In this regard, as described above, according to the first sequence, $C_xH_y$ is adsorbed onto a Si layer in the second step and Si is adsorbed and deposited in the third step, resulting in increased probability of forming a Si—C—Si bond. Thus, Si forming a Si—C—Si bond functions as a blocking layer of C against an attack of nitrogen in the fourth step. Accordingly, saturating the nitridation of the third layer by $NH_3$ gas in the fourth step is possible. That is, nitridation can be uniformly processed by increasing a nitriding force while restraining separation of C. As a result, uniformity in a film thickness on a wafer surface of a SiCN film may be enhanced.

However, in a conventional CVD method, a plurality of gases containing a plurality of elements constituting a formed thin film are simultaneously supplied. In this case, a ratio of flow rates of the supplied gases may be, for example, considered to be controlled during the supply of gases in order to control a composition ratio of the formed thin film. However, the composition ratio of the formed thin film cannot be controlled even by controlling supply conditions such as a substrate temperature during the supply of the gases, a pressure in the process chamber, and a gas supply time.

In the ALD method, a plurality of gases containing a plurality of elements constituting a formed thin film are alternately supplied. In this case, a flow rate of a supplied gas and a gas supply time during the gas supply may be, for example, considered to be controlled to control a composition ratio of the formed thin film. However, in the ALD method, since the supply of a source gas aims at saturating adsorption of the source gas onto a surface of a substrate, controlling a pressure in a process chamber is unnecessary. That is, saturation of adsorption of the source gas is generated at a pressure equal to or less than a predetermined pressure in which the source gas is adsorbed at a reaction temperature, and, when a pressure in the process chamber is set to a pressure equal to or less than the predetermined pressure, saturation of adsorption of the source gas may be realized under any pressures. Accordingly, when a film is formed by a conventional ALD method, a pressure in the process chamber is determined according to an exhaust capability of a substrate processing apparatus with respect to an amount of supplied gas. When a pressure of the process chamber is changed, chemical adsorption of the source gas onto a surface of the substrate may be hampered or the reaction may be close to the CVD reaction, and thus film formation using the ALD method may not be properly performed. Further, since an ALD reaction (saturation of adsorption, surface reaction) is repeatedly performed to form a thin film of a predetermined thickness using the ALD method, when the ALD reactions are not sufficiently performed until they are saturated, deposition becomes insufficient, making it impossible to obtain a sufficient deposition rate. Thus, in the ALD method, a composition ratio of a thin film cannot be easily controlled by controlling a pressure in the process chamber.

In this regard, according to the embodiment of the present invention, in either the first sequence or the second sequence, a composition ratio of a thin film is controlled by alternately supplying a plurality of gases containing a plurality of elements constituting a formed thin film and controlling a pressure or a pressure and a gas supply time in a process chamber in the respective steps under a condition where a CVD reaction is caused.

When a composition ratio of a thin film is controlled by controlling a pressure in a process chamber in respective steps, effects caused by a difference between other substrate processing apparatuses may be reduced. That is, a composition ratio of thin films may be controlled under the same control conditions and in the same manner even in the other substrate processing apparatuses. In this case, since the composition ratio of the thin film may be finely regulated by controlling a gas supply time in the respective steps, controllability of the composition ratio of the thin film may be enhanced. In addition, the composition ratio of the thin film may be controlled while increasing a film formation rate by controlling a pressure in the process chamber in the respective steps. That is, a composition ratio of a thin film may be controlled, for example, while increasing a growth rate of the silicon-containing layer formed in the first step in each sequence by controlling a pressure in the process chamber. In this way, according to the embodiment of the present invention, the composition ratio of the thin film may be controlled under the same control conditions and in the same manner even in the other substrate processing apparatuses, controllability of the composition ratio of the thin film may be enhanced, and the film formation rate, i.e. productivity may also be enhanced.

Meanwhile, for example, in formation of a film using the ALD method, when a composition ratio of a thin film is controlled by controlling flow rates of supplied gases or a gas supply time in the respective steps, effects caused by a difference between other substrate processing apparatuses is increased. That is, even when the same control is performed to the other substrate processing apparatuses, a composition ratio of a thin film cannot be controlled in the same manner. For example, even when the flow rate of supplied gas and the gas supply time are set to the same flow rate of supplied gas and the same gas supply time in the other substrate processing apparatuses, pressures in the process chambers are not the same due to the difference between the other substrate processing apparatuses. Thus, in this case, a desired composition ratio cannot be obtained since the pressures in the process chambers are different in the substrate processing apparatuses. Moreover, since the pressures in the process chambers are different in the substrate processing apparatuses, chemical adsorption of a source gas onto a surface of a substrate may be hampered or the reaction may be close to the CVD reaction, and thus film formation using the ALD method may not be properly performed.

Although the embodiments of the present invention have been described in detail, the present invention is not limited thereto but may be modified without departing from the scope of the present invention.

For example, although a case of forming a SiCN film (semiconductor insulating film) including Si, which is a semiconductor element, as an insulating film has been described, the present invention may be applied to the case of forming a metal carbonitride film (metal insulating film) containing a metal element such as titanium (Ti), zirconium (Zr), hafnium (Hf), tantalum (Ta), aluminum (Al), molybdenum (Mo), gallium (Ga), or germanium (Ge).

For example, the present invention may be applied to a titanium carbonitride film (TiCN film), a zirconium carbonitride film (ZrCN film), a hafnium carbonitride film (HfCN film), a tantalum carbonitride film (TaCN film), an aluminum carbonitride film (AlCN film), a molybdenum carbonitride film (MoCN film), a gallium carbonitride film (GaCN film), or a germanium carbonitride film (GeCN film), or a metal carbonitride film obtained by combination or mixture thereof.

In this case, a film may be formed though the sequences (first sequence and second sequence) as in the above-described embodiments using Ti source gas, Zr source gas, Hf source gas, Ta source gas, Al source gas, Mo source gas, Ga source gas, or Ge source gas instead of the Si source gas.

That is, in this case, for example, a metal carbonitride film having a predetermined thickness is formed on a wafer in the first sequence by performing a cycle including the steps of:

(a) supplying a source gas including a metal element into a process vessel accommodating the substrate under a condition where a CVD reaction is caused, and forming a first layer including the metal element on the substrate (first step);

(b) supplying a carbon-containing gas into the process vessel to form a layer including C (carbon) on the first layer including the metal element, and forming a second layer including the metal element and the C (second step);

(c) supplying the source gas into the process vessel under a condition where a CVD reaction is caused to additionally form a layer including the metal element on the second layer, and forming a third layer including the metal element and the C (third step); and (d) supplying a nitrogen-containing gas into the process vessel to nitride the third layer, and forming a metal carbonitride layer serving as a fourth layer including the metal element, the C, and N (nitrogen) (fourth step), a predetermined number of times (once or more), preferably a plurality of times.

In this case, for example, a metal carbonitride film having a predetermined thickness is formed on a wafer in the second sequence by performing a cycle including the steps of:

(a) supplying a source gas including a metal element into a process vessel accommodating the substrate under a condition where a CVD reaction is caused, and forming a first layer including the metal element on the substrate (first step);

(b) supplying a carbon-containing gas into the process vessel to form a layer including C on the first layer including the metal element, and forming a second layer including the metal element and the C (second step); and (c) supplying a nitrogen-containing gas into the process vessel to nitride the second layer, and forming a metal carbonitride layer serving as a third layer including the metal element, the C, and N (third step), a predetermined number of times (once or more), preferably a plurality of times.

For example, when a TiCN film is formed as the metal carbonitride film, a source containing Ti may include an organic source such as tetrakisethylmethylaminotitanium (Ti[N($C_2H_5$)($CH_3$)]$_4$, TEMAT), tetrakisdimethylaminotitanium (Ti[N($CH_3$)$_2$]$_4$, TDMAT), and tetrakisdiethylaminotitanium (Ti[N($C_2H_5$)$_2$]$_4$, TDEAT), or an inorganic source such as titaniumtetrachloride ($TiCl_4$). The same gas described in the embodiment of the present invention may be used as a carbon-containing gas or a nitrogen-containing gas. The processing conditions may be, for example, set to the same processing conditions as described in the embodiment of the present invention, but a temperature of the wafer is more preferably, for example, in a range of 100 to 500° C. and a pressure in the process chamber is more preferably in a range of 1 to 1,000 Pa.

As another example, when a ZrCN film is formed as the metal carbonitride film, a source containing Zr may include an organic source such as tetrakisethylmethylaminozirconium (Zr[N($C_2H_5$)($CH_3$)]$_4$, TEMAZ), tetrakisdimethylaminozirconium (Zr[N($CH_3$)$_2$]$_4$, TDMAZ), and tetrakisdiethylaminozirconium (Zr[N($C_2H_5$)$_2$]$_4$, TDEAZ), or an inorganic source such as zirconiumtetrachloride ($ZrCl_4$). The same gas described in the embodiment of the present invention may be used as a carbon-containing gas or a nitrogen-containing gas. Also, the processing conditions may be, for example, set to the same processing conditions as described in the embodiment of the present invention, but a temperature of the wafer is more preferably, for example, in a range of 100 to 400° C. and a pressure in the process chamber is more preferably in a range of 1 to 1,000 Pa.

Also, for example, when a HfCN film is formed as the metal carbonitride film, a source containing Hf may include an organic source such as tetrakisethylmethylaminohafnium (Hf[N($C_2H_5$)($CH_3$)]$_4$, TEMAH), tetrakisdimethylaminohafnium (Hf[N($CH_3$)$_2$]$_4$, TDMAH), and tetrakisdiethylaminohafnium (Hf[N($C_2H_5$)$_2$]$_4$, TDEAH), or an inorganic source such as hafniumtetrachloride ($HfCl_4$). The same gas described in the embodiment of the present invention may be used as a carbon-containing gas or a nitrogen-containing gas. The processing conditions may be, for example, set to the same processing conditions as described in the embodiment of the present invention, but a temperature of the wafer is more preferably, for example, in a range of 100 to 400° C. and a pressure in the process chamber is more preferably in a range of 1 to 1,000 Pa.

Also, for example, when an AlCN film is formed as the metal carbonitride film, a source containing Al may include an organic source such as trimethylaluminum (Al($CH_3$)$_3$, TMA), or an inorganic source such as trichloroaluminum ($AlCl_3$). The same gas described in the embodiment of the present invention may be used as a carbon-containing gas or a nitrogen-containing gas. The processing conditions may be, for example, set to the same processing conditions as described in the embodiment of the present invention, but a temperature of the wafer is more preferably, for example, in a range of 100 to 400° C. and a pressure in the process chamber is more preferably in a range of 1 to 1,000 Pa.

As described above, the present invention may be applied to the case of forming a carbonitride film containing a certain element such as a semiconductor element or a metal element.

Examples

Next, examples of the present invention will be described.

In this example, SiCN films were formed by controlling composition ratios through the first sequence and the second sequence according to the above-described embodiment and the composition ratios of the SiCN films and uniformity in film thicknesses in wafer surfaces were measured. DCS gas was used as the silicon-containing gas, $C_3H_6$ gas was used as the carbon-containing gas, and $NH_3$ gas was used as the nitrogen-containing gas. The composition ratios were controlled by regulating factors for controlling the composition ratios, i.e. a pressure, or a pressure and gas supply time (irradiation time). In controlling the composition ratios, the higher the pressure is and the longer the gas supply time is, the higher the reaction is, and thus layers formed in the corresponding steps gets thicker or an adsorption amount is increased. That is, the number of atoms given in the corresponding steps becomes larger. In the meantime, when reaction species that saturates adsorption or a reaction are used, there is a case that a film thickness may not become thicker than one atomic layer.

First, a SiCN film having a C concentration of approximately 8 atoms % was formed on a wafer by regulating a pressure in a process chamber and a supply time of $C_3H_6$ gas in the second step of the first sequence. In this case, processing conditions are set as follows.

<First Sequence (Reference Processing Condition)>
(First Step)
Temperature in process chamber: 630° C.
Pressure in process chamber: 133 Pa (1 Torr)
Flow rate of supplied DCS gas: 1 slm
Irradiation time of DCS gas: 12 seconds
(Second Step)
Temperature in process chamber: 630° C.
Pressure in process chamber: 133 Pa (1 Torr)
Flow rate of supplied $C_3H_6$ gas: 1 slm
Irradiation time of $C_3H6$ gas: 12 seconds
(Third Step)
Temperature in process chamber: 630° C.
Pressure in process chamber: 133 Pa (1 Torr)
Flow rate of supplied DCS gas: 1 slm
Irradiation time of DCS gas: 12 seconds
(Fourth Step)
Temperature in process chamber: 630° C.
Pressure in process chamber: 866 Pa (6.5 Torr)
Flow rate of supplied $NH_3$ gas: 9 slm
Irradiation time of $NH_3$ gas: 18 seconds An attempt was made to form a SiCN film having a C concentration of approximately 16 atoms % by adjusting each processing condition with reference to the above-described processing conditions.

As a result, a SiCN film having a C concentration of approximately 16 atoms % was obtained by changing a pressure in the process chamber from 133 Pa (1 Torr) to 866 Pa (6.5 Torr) in the second step. In this case, it was confirmed that a SiCN film having a C ratio higher than that of a SiCN film formed by the reference processing conditions may be formed. That is, it was confirmed that a SiCN film having a high C ratio may be formed by setting a pressure in the process chamber in the second step to a higher pressure than a pressure in the process chamber in the reference processing condition. It was also confirmed that as C concentration increases, N concentration decreases. The processing conditions other than the pressure in the process chamber in the second step were set to the same conditions as in the reference processing conditions. That is, the processing conditions in this case are set as follows.

<First Sequence (Change in Pressure During Supply of $C_3H_6$ Gas)>
(First Step)
Temperature in process chamber: 630° C.
Pressure in process chamber: 133 Pa (1 Torr)
Flow rate of supplied DCS gas: 1 slm
Irradiation time of DCS gas: 12 seconds
(Second Step)
Temperature in process chamber: 630° C.
Pressure in process chamber: 866 Pa (6.5 Torr)
Flow rate of supplied $C_3H_6$ gas: 1 slm
Irradiation time of $C_3H6$ gas: 12 seconds
(Third Step)
Temperature in process chamber: 630° C.
Pressure in process chamber: 133 Pa (1 Torr)
Flow rate of supplied DCS gas: 1 slm
Irradiation time of DCS gas: 12 seconds
(Fourth Step)
Temperature in process chamber: 630° C.
Pressure in process chamber: 866 Pa (6.5 Torr)
Flow rate of supplied $NH_3$ gas: 9 slm
Irradiation time of $NH_3$ gas: 18 seconds It was also confirmed that, even when an irradiation time of $C_3H_6$ gas is changed from 12 seconds to 48 seconds in the second step, a SiCN film having a C concentration of approximately 16 atoms % is obtained, making it possible to form a SiCN film having a C ratio higher than that of a SiCN film formed in the reference processing conditions. That is, it was confirmed that, even when an irradiation time of $C_3H_6$ gas in the second step is longer than that of $C_3H_6$ gas in the reference processing conditions, a SiCN film having a high C ratio may be formed. It was also confirmed that as C concentration increases, N concentration decreases. The processing conditions other than the irradiation time in the process chamber in the second step were set to the same conditions as in the reference processing conditions. That is, the processing conditions in this case are set as follows.

<First Sequence (Change in Irradiation Time During Supply of $C_3H_6$ Gas)>
(First Step)
Temperature in process chamber: 630° C.
Pressure in process chamber: 133 Pa (1 Torr)
Flow rate of supplied DCS gas: 1 slm
Irradiation time of DCS gas: 12 seconds
(Second Step)
Temperature in process chamber: 630° C.
Pressure in process chamber: 133 Pa (1 Torr)
Flow rate of supplied $C_3H_6$ gas: 1 slm
Irradiation time of $C_3H6$ gas: 48 seconds
(Third Step)
Temperature in process chamber: 630° C.
Pressure in process chamber: 133 Pa (1 Torr)
Flow rate of supplied DCS gas: 1 slm
Irradiation time of DCS gas: 12 seconds
(Fourth Step)
Temperature in process chamber: 630° C.
Pressure in process chamber: 866 Pa (6.5 Torr)
Flow rate of supplied $NH_3$ gas: 9 slm
Irradiation time of $NH_3$ gas: 18 seconds An attempt was made to form a SiCN film having the same C concentration in the second sequence based on the reference processing conditions of the above-described first sequence. As a result, it was confirmed that a SiCN film having a C concentration of approximately 8 atoms % may be obtained by regulating a supply time of $C_3H_6$ in the second step. In this case, the processing conditions are set as follows.

<Second Sequence>
(First Step)
Temperature in process chamber: 630° C.
Pressure in process chamber: 133 Pa (1 Torr)
Flow rate of supplied DCS gas: 1 slm
Irradiation time of DCS gas: 12 seconds
(Second Step)
Temperature in process chamber: 630° C.
Pressure in process chamber: 133 Pa (1 Torr)
Flow rate of supplied $C_3H_6$ gas: 1 slm
Irradiation time of $C_3H_6$ gas: 8 seconds
(Third Step)
Temperature in process chamber: 630° C.
Pressure in process chamber: 866 Pa (6.5 Torr)
Flow rate of supplied $NH_3$ gas: 9 slm
Irradiation time of $NH_3$ gas: 18 seconds The uniformities in film thicknesses on wafer surfaces of SiCN films having a C concentration of approximately 8 atoms %, which were formed by the first sequence and the second sequence, were measured. As a result, the uniformity in film thickness on a wafer surface of the SiCN film formed through the first sequence was ±0.6% and the uniformity in film thickness on the wafer surface of a SiCN film formed through the second sequence was ±1.4%. The uniformity in film thickness on a wafer surface represents a deviation degree of film thickness distribution on the wafer surface, and as the deviation degree is smaller, the uniformity in film thickness distribution is excellent.

According to the embodiment of the present invention, it can be seen that a SiCN film having an excellent uniformity in film thickness on a wafer surface may be formed in any of the first sequence and the second sequence. In addition, it can be seen that when a SiCN film according to the embodiment of the present invention is used as an insulating film, a surface of the SiCN film may be endowed with uniform performance, thereby contributing to enhanced performance of a semiconductor device or enhanced yield rate. In comparison of the first sequence with the second sequence, it can also be seen that an excellent uniformity in film thickness on the wafer surface may be achieved in the first sequence.

PREFERRED ASPECTS OF THE INVENTION

Hereinafter, preferred aspects according to the embodiments will be additionally stated.

According to one aspect of the present invention, there is provided a method of manufacturing a semiconductor device, including the steps of:

(a) supplying a source gas including an element into a process vessel accommodating a substrate under a condition where a CVD reaction is caused to form a first layer including the element on the substrate;

(b) supplying a carbon-containing gas into the process vessel to form a layer including a carbon on the first layer, thereby forming a second layer including the element and the carbon;

(c) supplying the source gas into the process vessel under the condition where the CVD reaction is caused to additionally form a layer including the element on the second layer, thereby forming a third layer including the element and the carbon;

(d) supplying a nitrogen-containing gas into the process vessel to nitride the third layer, thereby forming a carbonitride layer serving as a fourth layer including the element, the carbon and a nitrogen; and (e) performing a cycle including the steps (a) through (d) a predetermined number of times to form a carbonitride film having a predetermined thickness on the substrate.

Preferably, the step (b) includes forming a discontinuous chemical adsorption layer as the layer including the carbon on the first layer.

Preferably, the step (d) includes thermally nitriding the third layer under a condition where a nitridation reaction of the third layer by the nitrogen-containing gas is unsaturated.

Preferably, the step (a) includes forming a deposition layer of the element as the first layer on the substrate, the step (b) includes forming a discontinuous chemical adsorption layer as the layer including the carbon on the first layer, the step (c) includes forming a deposition layer of the element as the layer including the element on the second layer; and the step (d) includes thermally nitriding the third layer under a condition where a nitridation reaction of the third layer by the nitrogen-containing gas is unsaturated.

Preferably, the step (a) includes depositing the element on the substrate to form the first layer including the element, the step (b) includes forming a discontinuous chemical adsorption layer as the layer including the carbon on the first layer, the step (c) includes depositing the element on the second layer to form the layer including the element; and the step (d) includes nitriding a portion of a surface layer of the third layer.

Preferably, a composition of the carbonitride film is adjusted by controlling a pressure in the process vessel, or the pressure and a gas supply time in at least one of the steps (a) through (d).

Preferably, at least one of concentrations of the element, the carbon, and the nitrogen contained in the carbonitride film is adjusted by controlling a pressure in the process vessel, or the pressure and a gas supply time in at least one of the steps (a) through (d).

Preferably, the element is a semiconductor element or a metal element.

Preferably, the element is silicon.

According to another aspect of the present invention, there is provided a method of manufacturing a semiconductor device, including the steps of:

(a) supplying a silicon-containing gas into a process vessel accommodating a substrate under a condition where a CVD reaction is caused to form a first layer including a silicon on the substrate;

(b) supplying a carbon-containing gas into the process vessel to form a layer including a carbon on the first layer, thereby forming a second layer including the silicon and the carbon;

(c) supplying the silicon-containing gas into the process vessel under the condition where the CVD reaction is caused to additionally form a layer including the silicon on the second layer, thereby forming a third layer including the silicon and the carbon;

(d) supplying a nitrogen-containing gas into the process vessel to nitride the third layer, thereby forming a silicon carbonitride layer serving as a fourth layer including the silicon, the carbon, and nitrogen; and (e) performing a cycle including the steps (a) through (d) a predetermined number of times to form a silicon carbonitride film having a predetermined thickness on the substrate.

Preferably, the step (b) includes forming a discontinuous chemical adsorption layer as the layer including the carbon on the first layer.

Preferably, the step (d) includes thermally nitriding the third layer under a condition where a nitridation reaction of the third layer by the nitrogen-containing gas is unsaturated.

Preferably, the step (a) includes forming a deposition layer of the silicon as the first layer on the substrate, the step (b) includes forming a discontinuous chemical adsorption layer as the layer including the carbon on the first layer, the step (c) includes forming a deposition layer of the silicon as the layer including the silicon on the second layer; and the step (d) includes thermally nitriding the third layer under a condition where a nitridation reaction of the third layer by the nitrogen-containing gas is unsaturated.

Preferably, the step (a) includes depositing the silicon on the substrate to form the first layer including the silicon, the step (b) includes forming a discontinuous chemical adsorption layer as the layer including the carbon on the first layer, the step (c) includes depositing the silicon on the second layer to form the layer including the silicon; and the step (d) includes nitriding a portion of a surface layer of the third layer.

Preferably, a composition of the silicon carbonitride film is adjusted by controlling a pressure in the process vessel, or the pressure and a gas supply time in at least one of the steps (a) through (d).

Preferably, at least one of concentrations of the silicon, the carbon, and the nitrogen contained in the silicon carbonitride film is adjusted by controlling a pressure in the process vessel, or the pressure and a gas supply time in at least one of the steps (a) through (d).

According to still another aspect of the present invention, there is provided a method of processing a substrate, including the steps of:

(a) supplying a source gas including an element into a process vessel accommodating the substrate under a condition where a CVD reaction is caused to form a first layer including the element on the substrate;

(b) supplying a carbon-containing gas into the process vessel to form a layer including a carbon on the first layer, thereby forming a second layer including the element and the carbon;

(c) supplying the source gas into the process vessel under the condition where the CVD reaction is caused to additionally form a layer including the element on the second layer, thereby forming a third layer including the element and the carbon;

(d) supplying a nitrogen-containing gas into the process vessel to nitride the third layer, thereby forming a carbonitride layer serving as a fourth layer including the element, the carbon and nitrogen; and (e) performing a cycle including the steps (a) through (d) a predetermined number of times to form a carbonitride film having a predetermined thickness on the substrate.

According to yet another aspect of the present invention, there is provided a method of processing a substrate, including the steps of:

(a) supplying a silicon-containing gas into a process vessel accommodating the substrate under a condition where a CVD reaction is caused to form a first layer including a silicon on the substrate;

(b) supplying a carbon-containing gas into the process vessel to form a layer including a carbon on the first layer, thereby forming a second layer including the silicon and the carbon;

(c) supplying the silicon-containing gas into the process vessel under the condition where the CVD reaction is caused to additionally form a layer including the silicon on the second layer, thereby forming a third layer including the silicon and the carbon;

(d) supplying a nitrogen-containing gas into the process vessel to nitride the third layer, thereby forming a silicon carbonitride layer serving as a fourth layer including the silicon, the carbon and nitrogen; and (e) performing a cycle including the steps (a) through (d) a predetermined number of times to form a silicon carbonitride film having a predetermined thickness on the substrate.

According to yet another aspect of the prevent invention, there is provided a substrate processing apparatus including:

a process vessel configured to accommodate a substrate;

a heater configured to heat an interior of the process vessel;

a source gas supply system configured to supply a source gas including an element into the process vessel;

a carbon-containing gas supply system configured to supply a carbon-containing gas into the process vessel;

a nitrogen-containing gas supply system configured to supply a nitrogen-containing gas into the process vessel;

a pressure regulating unit configured to regulate a pressure in the process vessel; and a control unit configured to control the heater, the source gas supply system, the carbon-containing gas supply system, the nitrogen-containing gas supply system, and the pressure regulating unit such that a carbonitride film having a predetermined thickness is formed on the substrate by carrying out processes of (a) supplying a source gas including an element into a process vessel accommodating the substrate under a condition where a CVD reaction is caused to form a first layer including the element on the substrate; (b) supplying a carbon-containing gas into the process vessel to form a layer including a carbon on the first layer, thereby forming a second layer including the element and the carbon; (c) supplying the source gas into the process vessel under the condition where the CVD reaction is caused to additionally form a layer including the element on the second layer, thereby forming a third layer including the element and the carbon; (d) supplying a nitrogen-containing gas into the process vessel to nitride the third layer, thereby forming a carbonitride layer serving as a fourth layer including the element, the carbon and nitrogen; and (e) performing a cycle including the processes (a) through (d) a predetermined number of times.

According to yet another aspect of the prevent invention, there is provided a substrate processing apparatus including:

a process vessel configured to accommodate a substrate;

a heater configured to heat an interior of the process vessel;

a silicon-containing gas supply system configured to supply a silicon-containing gas into the process vessel;

a carbon-containing gas supply system configured to supply a carbon-containing gas into the process vessel;

a nitrogen-containing gas supply system configured to supply a nitrogen-containing gas into the process vessel;

a pressure regulating unit configured to regulate a pressure in the process vessel; and a control unit configured to control the heater, the silicon-containing gas supply system, the carbon-containing gas supply system, the nitrogen-containing gas supply system, and the pressure regulating unit such that a silicon carbonitride film having a predetermined thickness is formed on the substrate by carrying out processes of (a) supplying the silicon-containing gas into a process vessel accommodating the substrate under a condition where a CVD reaction is caused to form a first layer including a silicon on the substrate; (b) supplying a carbon-containing gas into the process vessel to form a layer including a carbon on the first layer, thereby forming a second layer including the silicon and the carbon; (c) supplying the silicon-containing gas into the process vessel under the condition where the CVD reaction is caused to additionally form a layer including the silicon on the second layer, thereby forming a third layer including the silicon and the carbon; (d) supplying a nitrogen-containing gas into the process vessel to nitride the third layer, thereby forming a silicon carbonitride layer serving as a fourth layer including the silicon, the carbon and nitrogen; and (e) performing a cycle including the processes (a) through (d) a predetermined number of times.

What is claimed is:

1. A method of manufacturing a semiconductor device, comprising steps of:

(a) supplying a source gas containing an element into a process vessel accommodating a substrate under a condition where a CVD reaction is caused to form a first layer including the element on the substrate;

(b) supplying a carbon-containing gas into the process vessel to form a layer including a carbon on the first layer, thereby forming a second layer including the element and the carbon;

(c) supplying the source gas containing the element into the process vessel under the condition where the CVD reaction is caused to additionally form a layer including the element on the second layer, thereby forming a third layer including the element and the carbon;

(d) supplying a nitrogen-containing gas into the process vessel to nitride the third layer, thereby forming a carbonitride layer serving as a fourth layer including the element, the carbon and a nitrogen; and (e) performing a cycle including the steps (a) through (d) a predetermined number of times to form a carbonitride film having a predetermined thickness on the substrate.

2. The method according to claim 1, wherein the step (b) comprises forming a discontinuous chemical adsorption layer as the layer including the carbon on the first layer.

3. The method according to claim 1, wherein the step (d) comprises thermally nitriding the third layer under a condition where a nitridation reaction of the third layer by the nitrogen-containing gas is unsaturated.

4. The method according to claim 1, wherein the step (a) comprises forming a deposition layer of the element as the first layer on the substrate,
the step (b) comprises forming a discontinuous chemical adsorption layer as the layer including the carbon on the first layer,
the step (c) comprises forming a deposition layer of the element as the layer including the element on the second layer; and
the step (d) comprises thermally nitriding the third layer under a condition where a nitridation reaction of the third layer by the nitrogen-containing gas is unsaturated.

5. The method according to claim 1, wherein the step (a) comprises depositing the element on the substrate to form the first layer including the element,
the step (b) comprises forming a discontinuous chemical adsorption layer as the layer including the carbon on the first layer,
the step (c) comprises depositing the element on the second layer to form the layer including the element; and
the step (d) comprises nitriding a portion of a surface layer of the third layer.

6. The method according to claim 1, wherein a composition of the carbonitride film is adjusted by controlling a pressure in the process vessel, or the pressure and a gas supply time in at least one of the steps (a) through (d).

7. The method according to claim 1, wherein at least one of concentrations of the element, the carbon, and the nitrogen contained in the carbonitride film is adjusted by controlling a pressure in the process vessel, or the pressure and a gas supply time in at least one of the steps (a) through (d).

8. The method according to claim 1, wherein the element is a semiconductor element or a metal element.

9. The method according to claim 1, wherein the element is silicon.

10. The method according to claim 1, wherein the source gas in the step (c) and the source gas in the step (a) comprise a same material.

11. The method according to claim 1, wherein the source gas in the step (c) and the source gas in the step (a) comprise a same element.

12. The method according to claim 1, wherein the layer including the element formed in the step (c) and the first layer including the element formed in the step (a) comprise a same material.

13. The method according to claim 1, wherein the layer including the element formed in the step (c) and the first layer including the element formed in the step (a) comprise a same element.

14. A method of processing a substrate, comprising steps of:
(a) supplying a source gas containing an element into a process vessel accommodating the substrate under a condition where a CVD reaction is caused to form a first layer including the element on the substrate;
(b) supplying a carbon-containing gas into the process vessel to form a layer including a carbon on the first layer, thereby forming a second layer including the element and the carbon;
(c) supplying the source gas containing the element into the process vessel under the condition where the CVD reaction is caused to additionally form a layer including the element on the second layer, thereby forming a third layer including the element and the carbon;
(d) supplying a nitrogen-containing gas into the process vessel to nitride the third layer, thereby forming a carbonitride layer serving as a fourth layer including the element, the carbon and nitrogen; and
(e) performing a cycle including the steps (a) through (d) a predetermined number of times to form a carbonitride film having a predetermined thickness on the substrate.

15. A substrate processing apparatus comprising:
a process vessel configured to accommodate a substrate;
a heater configured to heat the substrate in the process vessel;
a source gas supply system configured to supply a source gas containing an element into the process vessel;
a carbon-containing gas supply system configured to supply a carbon containing gas into the process vessel;
a nitrogen-containing gas supply system configured to supply a nitrogen-containing gas into the process vessel;
a pressure regulating unit configured to regulate a pressure in the process vessel; and
a control unit configured to control the heater, the source gas supply system, the carbon-containing gas supply system, the nitrogen-containing gas supply system, and the pressure regulating unit such that a carbonitride film having a predetermined thickness is formed on the substrate by carrying out processes of (a) supplying the source gas containing the element into a process vessel accommodating the substrate under a condition where a CVD reaction is caused to form a first layer including the element on the substrate; (b) supplying the carbon-containing gas into the process vessel to form a layer including a carbon on the first layer, thereby forming a second layer including the element and the carbon; (c) supplying the source gas containing the element into the process vessel under the condition where the CVD reaction is caused to additionally form a layer including the element on the second layer, thereby forming a third layer including the element and the carbon; (d) supplying the nitrogen-containing gas into the process vessel to nitride the third layer, thereby forming a carbonitride layer serving as a fourth layer including the element, the carbon and a nitrogen; and (e) performing a cycle including the processes (a) through (d) a predetermined number of times.

* * * * *